(12) United States Patent
Kim et al.

(10) Patent No.: US 8,486,787 B2
(45) Date of Patent: Jul. 16, 2013

(54) METHOD OF FABRICATING SEMICONDUCTOR DEVICE

(75) Inventors: Nam-Gun Kim, Seoul (KR); Sung-Il Cho, Seoul (KR); Yoon-Jae Kim, Yongin-si (KR); Doo-Young Lee, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 289 days.

(21) Appl. No.: 13/075,334

(22) Filed: Mar. 30, 2011

(65) Prior Publication Data
US 2011/0256719 A1 Oct. 20, 2011

(30) Foreign Application Priority Data
Apr. 14, 2010 (KR) .................. 10-2010-0034455

(51) Int. Cl.
*H01L 21/00* (2006.01)
(52) U.S. Cl.
USPC ........................ 438/279; 438/672; 438/675

(58) Field of Classification Search
USPC .......................................... 438/279, 672, 675
See application file for complete search history.

(56) References Cited

U.S. PATENT DOCUMENTS

| 6,969,676 | B2 | 11/2005 | Schwan et al. | |
| 7,435,634 | B2 * | 10/2008 | Kim et al. | 438/153 |
| 7,998,870 | B2 * | 8/2011 | Nam | 438/700 |

FOREIGN PATENT DOCUMENTS

| JP | 11-074174 | 3/1999 |
| KR | 10-0390948 | 7/2003 |

* cited by examiner

*Primary Examiner* — Richard Booth
(74) *Attorney, Agent, or Firm* — Stanzione & Kim, LLP

(57) ABSTRACT

A method of fabricating a semiconductor device includes forming a first contact opening having a relatively larger depth than a second contact opening to expose first and second contacts through an insulation layer, where the first and second contacts are located at different depths with respect to an upper surface of the insulation layer. Therefore, it is possible to prevent excessive over-etch of the second contact opening and minimize etching damage to the contact region exposed by the second contact opening.

20 Claims, 21 Drawing Sheets

METHOD OF FABRICATING SEMICONDUCTOR DEVICE

CROSS-REFERENCE TO RELATED APPLICATIONS

This application claims the benefit of priority under 35 U.S.C. §119 to Korean Patent Application No. 10-2010-0034455 filed on Apr. 14, 2010, the disclosure of which is hereby incorporated by reference in its entirety.

BACKGROUND

1. Field of the Invention

Embodiments of the present general inventive concept relate to a method of fabricating a semiconductor device.

2. Description of the Related Art

As semiconductor devices become highly integrated, techniques for forming contacts of different heights are needed.

SUMMARY

Embodiments of the present general inventive concept provide a method of fabricating a semiconductor device capable of stably forming contact openings having different depths.

Additional aspects and utilities of the present general inventive concept will be set forth in part in the description which follows and, in part, will be obvious from the description, or may be learned by practice of the present general inventive concept.

Features and/or utilities of the present general inventive concept may be realized by a method of fabricating a semiconductor device including preparing a substrate having a first region and a second region. A first element is formed on the first region of the substrate. A second element having an upper surface disposed at a higher level than the first element is formed on the second region of the substrate. The method may include forming an insulating layer to cover the first and second elements, and forming a mask on the insulating layer. Photolithography and etching processes are performed on the mask to form a first mask opening passing through the mask and exposing the insulating layer on the first region, and to form a preliminary mask opening not exposing the insulating layer on the second region. The insulating layer exposed by the first mask opening may be etched to form a preliminary contact opening on the first region. The mask remaining under the preliminary mask opening may be etched to form a second mask opening on the second region to expose the insulating layer under the preliminary mask opening. The insulating layer between a bottom region of the preliminary contact opening and the first element on the first region may be etched to form a first contact opening exposing the first element, and the insulating layer exposed by the second mask opening on the second region may be etched to form a second contact opening exposing the second element.

The mask may be formed of a different material than the insulating layer.

The method may further include removing the mask.

The method may further include forming conductive contact plugs to fill the first and second contact openings.

The second contact opening may have a smaller planar area than the first contact opening.

The first and second elements may include different conductive materials.

The first and second elements may include a silicon material.

The method may further include forming a sacrificial mask having openings on the mask after forming the mask, and etching and removing the sacrificial mask during etching of the insulating layer to form the preliminary contact opening.

Forming the insulating layer may include forming a first insulating layer after forming the first element, and forming a second insulating layer to cover the second element and the first insulating layer after forming the second element.

The first element may be a source/drain of a first MOS transistor, and the second element may be a conductive pattern formed on a source/drain of a second MOS transistor.

The method may further include, before forming the insulating layer, forming a third element having an upper surface covered by a capping layer on a third region of the substrate, forming a third mask opening passing through the mask to expose the insulating layer on the third region while the first mask opening is formed, etching the insulating layer on the third region to form a third preliminary contact opening while the preliminary contact opening is formed, and etching the capping layer under the third preliminary contact opening and forming a third contact opening to expose the third element while the first and second contact openings are formed.

Here, the capping layer may be formed of a different material than the insulating layer.

In yet another embodiment, the insulating layer may include a silicon oxide layer, and the mask may include at least one of a carbon-containing insulating material and a silicon material.

Features and/or utilities of the present general inventive concept may also be realized by a method of fabricating a semiconductor device including forming a first element on a substrate. A first insulating layer may be formed on the substrate having the first element. A second element may be formed on the substrate having the first element, wherein the second element is spaced apart from the first element and has an upper surface disposed at a higher level than the first element. A second insulating layer may be formed to cover the second element and the first insulating layer. A mask may be formed on the second insulating layer. Photolithography and etching processes may be performed on the mask to form a first mask opening passing through the mask and exposing the second insulating layer and to form a preliminary mask opening not exposing the second insulating layer. The first insulating layer under the first mask opening may be etched and a preliminary contact opening may be formed without exposing the first element. A mask remaining under the preliminary mask opening may be etched and a second mask opening may be formed to expose the second insulating layer under the preliminary mask opening, after forming the preliminary contact opening. The second insulating layer between a bottom region of the preliminary contact opening and the first element may be etched to form a first contact opening exposing the first element, and the second insulating layer exposed by the second mask opening may be etched to form a second contact opening exposing the second element.

The mask may be formed of a different material than the first and second insulating materials.

The method may further include removing the mask.

The second contact opening may have a smaller planar area than the first contact opening.

The method may further include, before forming the first insulating layer, forming a third element having an upper surface covered by the capping layer of the substrate, forming a third mask opening passing through the mask and exposing the second insulating layer while the first mask opening may be formed, forming a third preliminary contact opening passing through the second insulating layer and extending to an upper part of the capping mask while the preliminary contact opening may be formed, and etching the capping layer to form a third contact opening exposing the third element while the first and second contact openings are formed.

The capping layer may be formed of a different material than the first and second insulating layers.

Features and/or utilities of the present general inventive concept may also be realized by a method of fabricating a semiconductor device including preparing a substrate having a first region and a second region. A first transistor including a first gate electrode and a first source/drain on the first region of the substrate may be formed and a second transistor including a second gate electrode and a second source/drain may be formed on the second region of the substrate. A first interlayer insulating layer may be formed on the substrate having the first and second transistors. A conductive pattern passing through the first interlayer insulating layer and electrically connected to the second source/drain may be formed. A second interlayer insulating layer covering the conductive pattern and the first interlayer insulating layer may be formed. A mask may be formed on the second interlayer insulating layer. Photolithography and etching processes may be performed on the mask to form a first mask opening passing through the mask and exposing the second interlayer insulating layer on the first region, and to form a preliminary mask opening not exposing the second interlayer insulating layer on the second region. The first and second interlayer insulating layers under the first mask opening may be etched to form a preliminary contact opening passing through the second interlayer insulating layer and extending into the first interlayer insulating layer on the first region without exposing the first source/drain. The mask remaining under the preliminary mask opening may be etched and a second mask opening may be formed to expose the second interlayer insulating layer under the preliminary mask opening on the second region. The first interlayer insulating layer remaining between a bottom region of the preliminary contact opening and the first source/drain may be etched to form a first contact opening exposing the first source/drain on the first region, and the second interlayer insulating layer exposed by the second mask opening may be etched to form a second contact opening exposing the conductive layer pattern on the second region. The mask may be removed.

Features and/or utilities of the present general inventive concept may also be realized by a method of fabricating a semiconductor device having at least first and second electrical contact surfaces and at least one insulation layer on the semiconductor substrate, the first electrical contact surface having a depth greater than the second electrical contact surface with respect to an upper surface of the insulation layer, the method including etching the at least one insulation layer to form first and second holes in first and second regions of the insulation layer above the first and second electrical contact surfaces, respectively, to expose the first and second electrical contact surfaces, the first hole having a planar area larger than the second hole, such that the first hole has a depth greater than the second hole after a same etching process is performed in each of the first and second regions.

Etching the at least one insulation layer includes forming an etching mask on the second insulation layer, performing at least a first etching to expose the second insulation layer via the first hole and to form the second hole in the etching mask to not expose the second insulation layer, performing at least a second etching to extend the first hole into the first insulation layer without exposing the first electrical contact surface and to extend the second hole to expose the second insulation layer, and performing at least a third etching to extend each of the first and second holes to expose each of the first and second contact surfaces, respectively.

The method may further include forming a sacrificial mask on the etching mask, locating a photoresist pattern above the sacrificial mask, and performing a photolithography process to form holes in the sacrificial mask to expose an upper surface of the etching mask, the holes in the sacrificial mask corresponding to locations of the first and second holes.

The at least second etching may include a first sub-etching process to etch only the first region to extend the first hole into the first insulation, and a second sub-etching process to etch only the second region to extend the second hole to expose the second insulation layer.

Performing the third etching may include simultaneously etching each of the first region and the second region to simultaneously extend each of the first hole and the second hole to expose each of the first electrical contact region and the second electrical contact region.

The method may further include removing the etching mask.

The method may further include filling the first and second holes with a conductive material, and forming a conductive pattern on the conductive material at a top of at least one of the first and second holes.

Features and/or utilities of the present general inventive concept may also be achieved by a method of fabricating a semiconductor device having at least first and second electrical contact surfaces at different heights with respect to a bottom surface of a semiconductor substrate and at least a first insulation layer on the semiconductor substrate, the method comprising including performing at least a first etching process on first and second regions of the first insulation layer corresponding to the first and second electrical contact surfaces, respectively, to form first and second holes in the first insulation layer above the first and second electrical contact surfaces, respectively, the first and second holes terminating above the first and second electrical contact surfaces without exposing the first and second electrical contact surfaces, and performing a second etching process simultaneously on the first and second regions to simultaneously extend each of the first hole and the second hole to expose the first electrical contact surface and the second electrical contact surface.

Performing the first etching process may include forming the first hole to have a planar area different from the second hole.

BRIEF DESCRIPTION OF THE DRAWINGS

The foregoing and other features and advantages of the present general inventive concept will be apparent from the more particular description of preferred embodiments of the general inventive concept, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
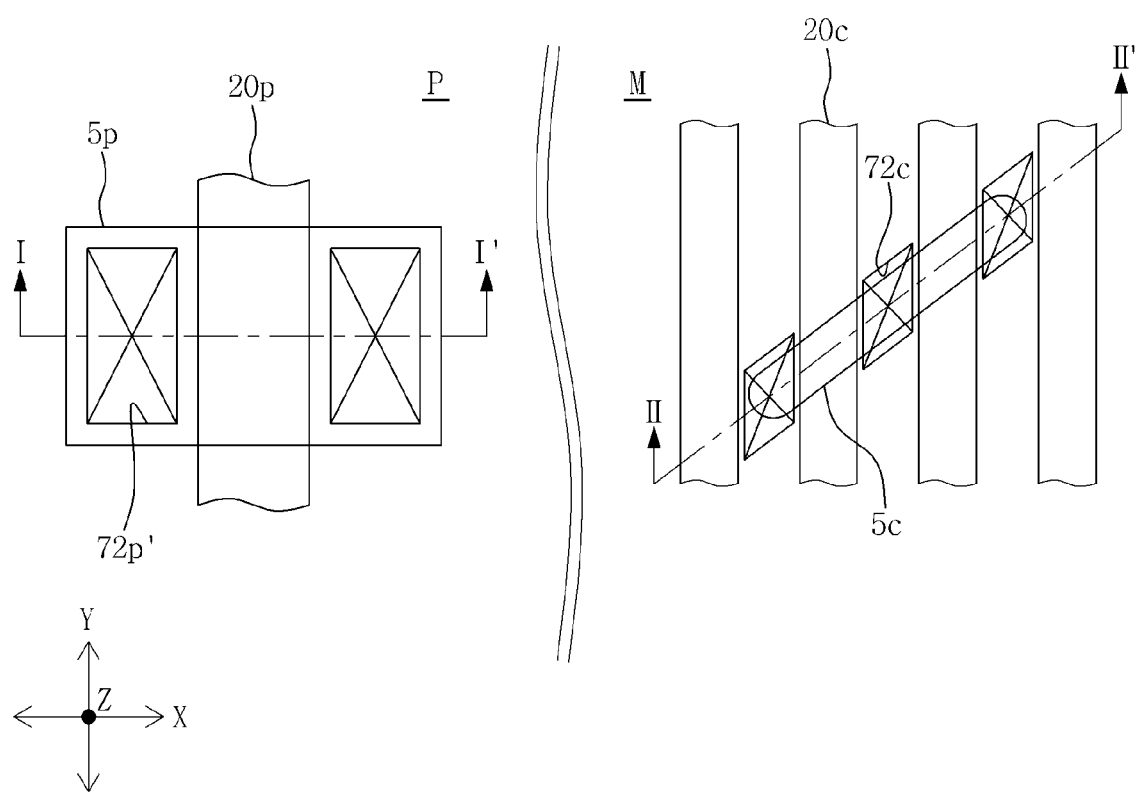
FIG. 1 is a schematic plan view of a semiconductor device in accordance with embodiments of the present general inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. For example, if a layer is described or recited as being "above" another layer or "higher than" another layer, this may refer to FIGS. 2A to 2J in which the layers are illustrated as being above and below each other. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Throughout the present specification and claims, when a figure and the accompanying description refer to forming layers or holes, the layers or holes may be formed in the same process, unless otherwise specified. For example, with reference to FIG. 2E, the first mask opening 71p and the preliminary mask opening 71c may be formed in the same etching process, such as by applying an etching solution or performing a lithographic process over an entire surface of the sacrificial mask 55, rather than by two separate processes of applying a solution or performing a lithographic process corresponding to each separate opening 71p and 71c.

FIG. 1 is a schematic plan view of a semiconductor device in accordance with embodiments of the present general inventive concept, and FIGS. 2A to 2J are cross-sectional views showing a semiconductor device in accordance with embodiments of the present general inventive concept. In FIGS. 2A to 2J, reference character "PC" is a region taken along line I-I' of FIG. 1, and reference character "MC" is a region taken along line II-II' of FIG. 1.

Hereinafter, a method of fabricating a semiconductor device in accordance with embodiments of the present general inventive concept will be described with reference to FIGS. 1 and 2A to 2J.

Figure 2A:
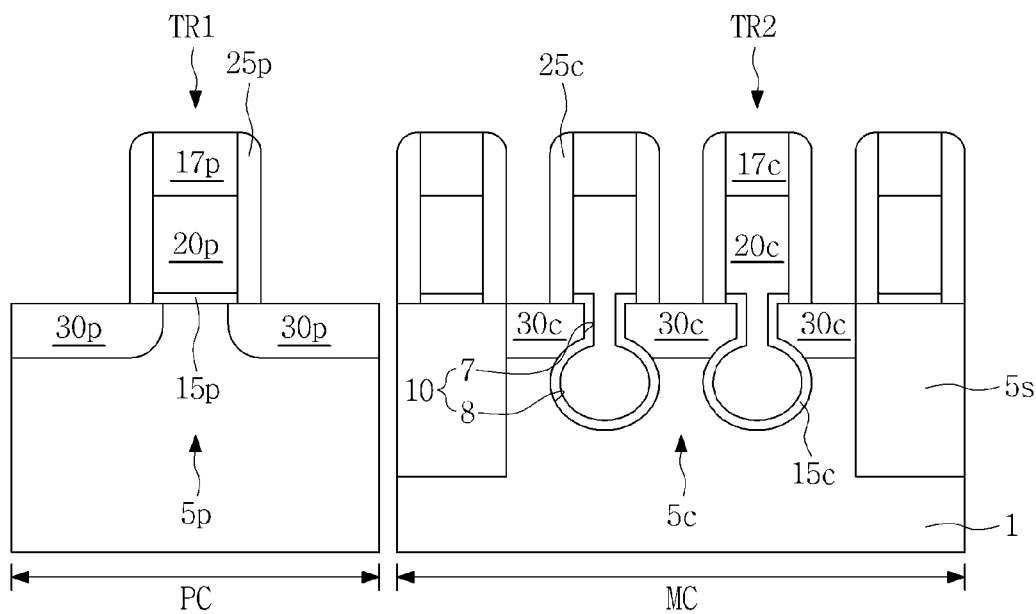
FIGS. 2A to 2J are cross-sectional views of a semiconductor device in accordance with embodiments of the present general inventive concept.

Referring to FIGS. 1 and 2A, a semiconductor substrate 1 having a first region PC and a second region MC may be prepared. The first region PC may be a circuit region including a first contact region, and the second region MC may be a circuit region including a second contact region. Here, the first contact region may have a larger planar area than the second contact region.

An isolation region 5s defining active regions 5p and 5c may be formed on the semiconductor substrate 1. The isolation region 5s may be formed using a shallow trench isolation technique. For example, forming the isolation region 5s may include etching a predetermined region of the semiconductor substrate 1 and forming an isolation trench, and forming an insulating layer to fill the isolation trench. Meanwhile, after etching the semiconductor substrate 1 and forming the isolation trench, a buffer oxidation layer and an insulating liner may be sequentially formed on an inner wall of the trench. Here, the buffer oxidation layer may be formed of a silicon oxide layer through a thermal oxidation method to cure damage that may occur on the semiconductor substrate 1 upon formation of the trench. The insulating liner may be formed of a material having good oxidation resistance characteristics, and the isolation oxide layer may be formed of a material having good gap fill characteristics and insulating characteristics and having an etch selectivity with respect to the semiconductor substrate 1.

In some embodiments, in order to increase an effective channel length of a transistor, one or more gate trenches 10 may be formed to cross the second active region 5c. For example, each of the gate trenches 10 may include a first gate trench 7 and a second gate trench 8 formed under the first gate trench 7. The second gate trench 8 may have a larger width than the first gate trench 7.

First and second gate dielectric layers 15p and 15c may be formed on the semiconductor substrate having the gate trenches 10. Each of the first and second gate dielectric layers 15p and 15c may be formed of a silicon oxide layer and/or a high-k dielectric layer. The high-k dielectric layer may be a dielectric material having a higher dielectric constant than the silicon oxide layer.

A first gate electrode 20p may be formed on the first gate dielectric layer 15p, and then, second gate electrodes 20c may be formed on the second gate dielectric layer 15c to fill the gate trenches 10. Each of the first and second gate electrodes 20p and 20c may include at least one of a polysilicon layer, a metal layer, a metal nitride layer, and a metal-semiconductor compound layer. Forming the first and second gate electrodes 20p and 20c may include forming a planarized conductive layer and first and second gate masks 17p and 17c on the semiconductor substrate having the first and second gate dielectric layers 15p and 15c, and etching the planarized conductive layer using the first and second gate masks 17p and 17c as etching masks. The first gate mask 17p may be used as a mask for forming the first gate electrode 20p, and the second gate mask 17c may be used as a mask for forming the second gate electrode 20c. The first and second gate masks 17p and 17c may be formed of an insulating material such as a silicon nitride layer, etc.

A first gate spacer 25p may be formed on sidewalls of the first gate electrode 20p and the first gate mask 17p, which are sequentially deposited, and a second gate spacer 25c may be formed on sidewalls of the second gate electrode 20c and the second gate mask 17c, which are sequentially deposited. The first and second gate spacers 25p and 25c may include at least one of a silicon oxide layer, a silicon nitride layer, and a silicon oxynitride (SiON) layer.

First source/drain regions 30p may be formed in the first active region 5p at both sides of the first gate electrode 20p. Second source/drain regions 30c may be formed in the second active region 5c at both sides of the second gate electrode 20c. The second source/drain regions 30c may be formed by injecting impurities into the second active region 5c before forming the gate trenches 10. Alternatively, the second source/drain regions 30c may be formed by injecting impurities into the second active region 5c after forming the second gate electrode 20c.

Therefore, a first transistor TR1 may be formed on the first region PC, and a second transistor TR2 may be formed the second region MC.

Figure 2B:
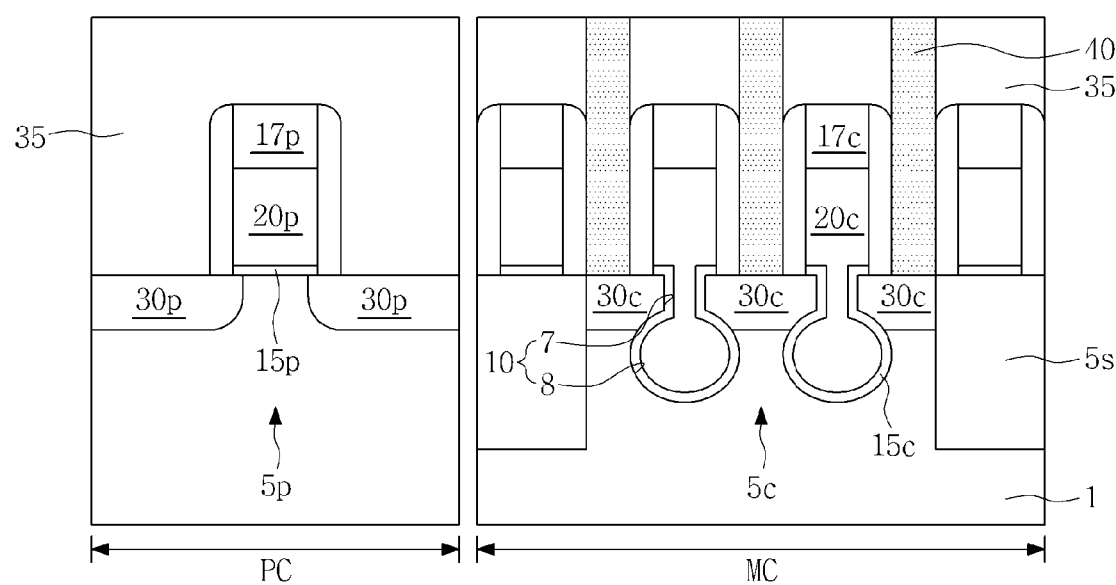

Referring to FIGS. 1 and 2B, a first interlayer insulating layer 35 may be formed on the entire semiconductor substrate having the first and second transistors TR1 and TR2. The first interlayer insulating layer 35 may be formed of an insulating material such as a silicon oxide, etc. The first interlayer insulating layer 35 may be formed to have a flat upper surface.

Conductive patterns 40 passing through the first interlayer insulating layer 35 and electrically connected to the second source/drain regions 30c may be formed. The conductive patterns 40 may include at least one of a polysilicon layer, a metal layer, a metal nitride layer, and a metal-semiconductor compound layer. For example, the conductive patterns 40 may include a metal-semiconductor compound layer such as a cobalt silicide, a titanium silicide, a nickel silicide, or the like formed at a portion which is in contact with the second source/drain regions 30c, and a polysilicon layer or a tungsten layer formed on the metal-semiconductor compound layer.

A second interlayer insulating layer 45 may be formed to cover the first interlayer insulating layer 35 and the conductive patterns 40. The second interlayer insulating layer 45 may be formed of an insulating material such as a silicon oxide layer, etc. In some embodiments, the second interlayer insulating layer 45 may have a smaller thickness than the first interlayer insulating layer 35.

Figure 2C:
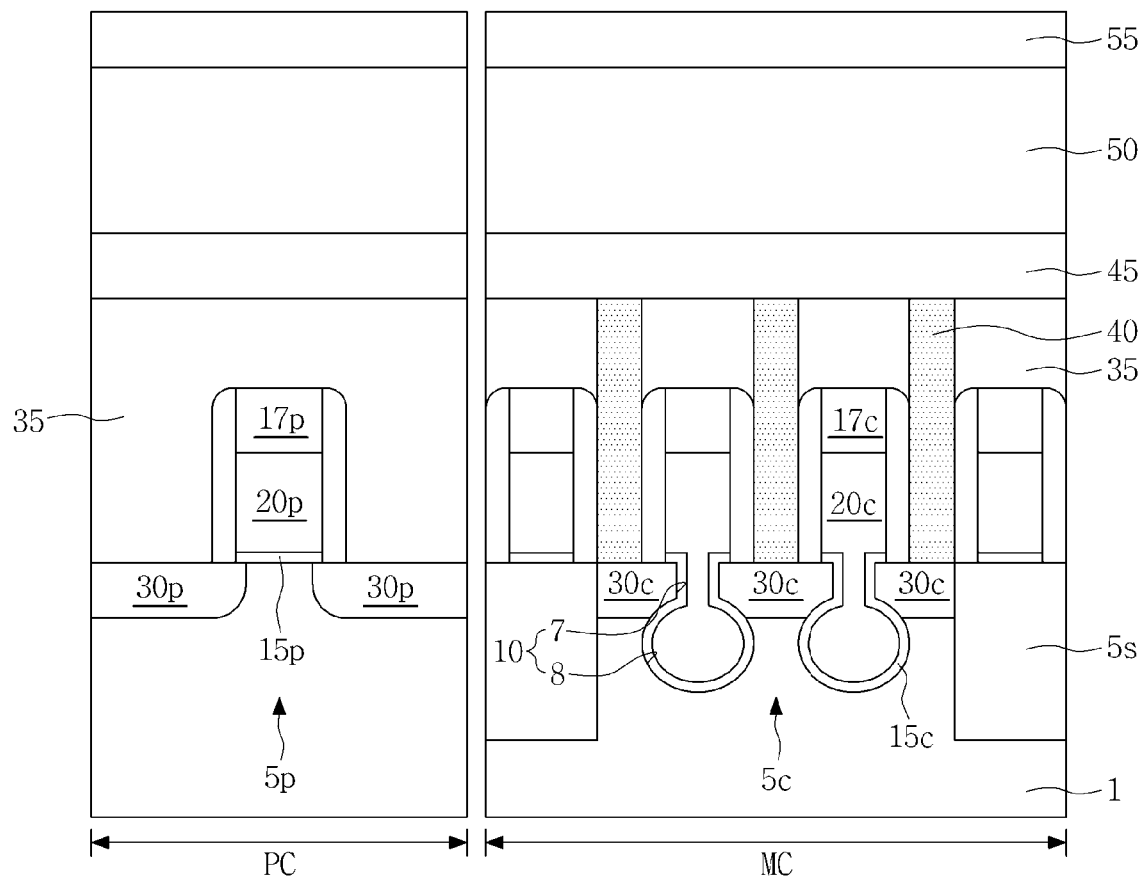

Referring to FIGS. 1 and 2C, an etching mask 50 may be formed on the second interlayer insulating layer 45. The etching mask 50 may be formed of a material having an etch selectivity with respect to the first and second interlayer insulating layers 35 and 35. For example, when the first and second interlayer insulating layers 35 and 45 are formed of a silicon oxide layer, the etching mask 50 may be formed of a silicon layer and/or a carbon-containing insulating layer. The carbon-containing insulating layer may be formed through a deposition method such as chemical vapor deposition (CVD), physical vapor deposition (PVD), etc., or using a spin coating method. For example, the carbon-containing insulating layer may be an amorphous carbon layer (ACL) or a spin on hardmask (SOH) containing carbon.

In some embodiments, the etching mask 50 may be formed of a single layer. Alternatively, the etching mask 50 may be formed of a stacked layer including a silicon layer and a carbon-containing insulating layer.

A sacrificial mask 55 may be formed on the etching mask 50. The sacrificial mask 55 may be formed of a material having an etch selectivity with respect to the etching mask 50. For example, when the etching mask 50 includes at least one of a silicon layer and a carbon-containing insulating layer, the sacrificial mask 55 may be formed of a silicon oxynitride (SiON) layer.

Figure 2D:
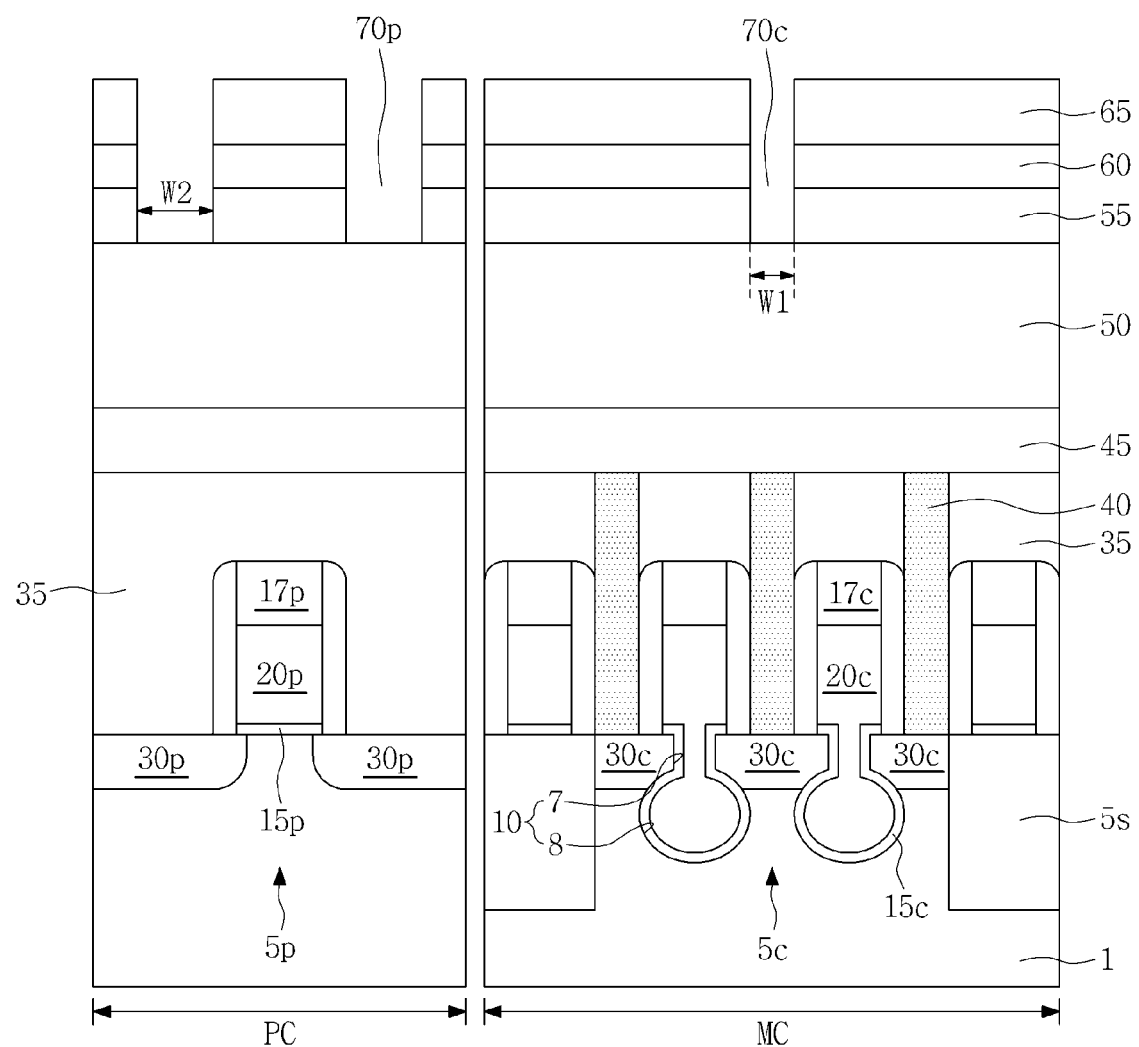

Referring to FIGS. 1 and 2D, an anti-reflective layer 60 may be formed on the sacrificial mask 55, and a photoresist pattern 65 may be formed on the anti-reflective layer 60. Then, the anti-reflective layer 60 and the sacrificial mask 55 are sequentially etched to form a first opening 70p on the first region pc and a second opening 70c on the second region MC. The etching mask 50 may be exposed by the first and second openings 70p and 70c.

The first opening 70p may have a larger width W2 than a width W1 of the second opening 70c. Planar areas of the first opening 70c and the second opening 70c may have sizes corresponding to the planar areas of first and second contact holes '72p' and 72c shown in FIG. 1. Therefore, the first opening 70p may be formed to have a larger planar area than the second opening 70c. In this embodiment, the second opening 70c may have a planar size smaller than that of the first opening 70p by about 30% or less. In other words, the area of the second opening 70c may be 30% or less than the area of the first opening 72p.

In the present specification and claims, a "planar size," "planar area," or other planar characteristic refers to a characteristic as viewed from the height axis Z, as in FIG. 1, for example. Thus, a planar area of an opening, such as the first opening 70c, refers to an area of the opening as defined by its outer edges on the plane defined by the axes X and Y and as viewed from the height direction Z, as illustrated in FIG. 1.

Figure 2E:
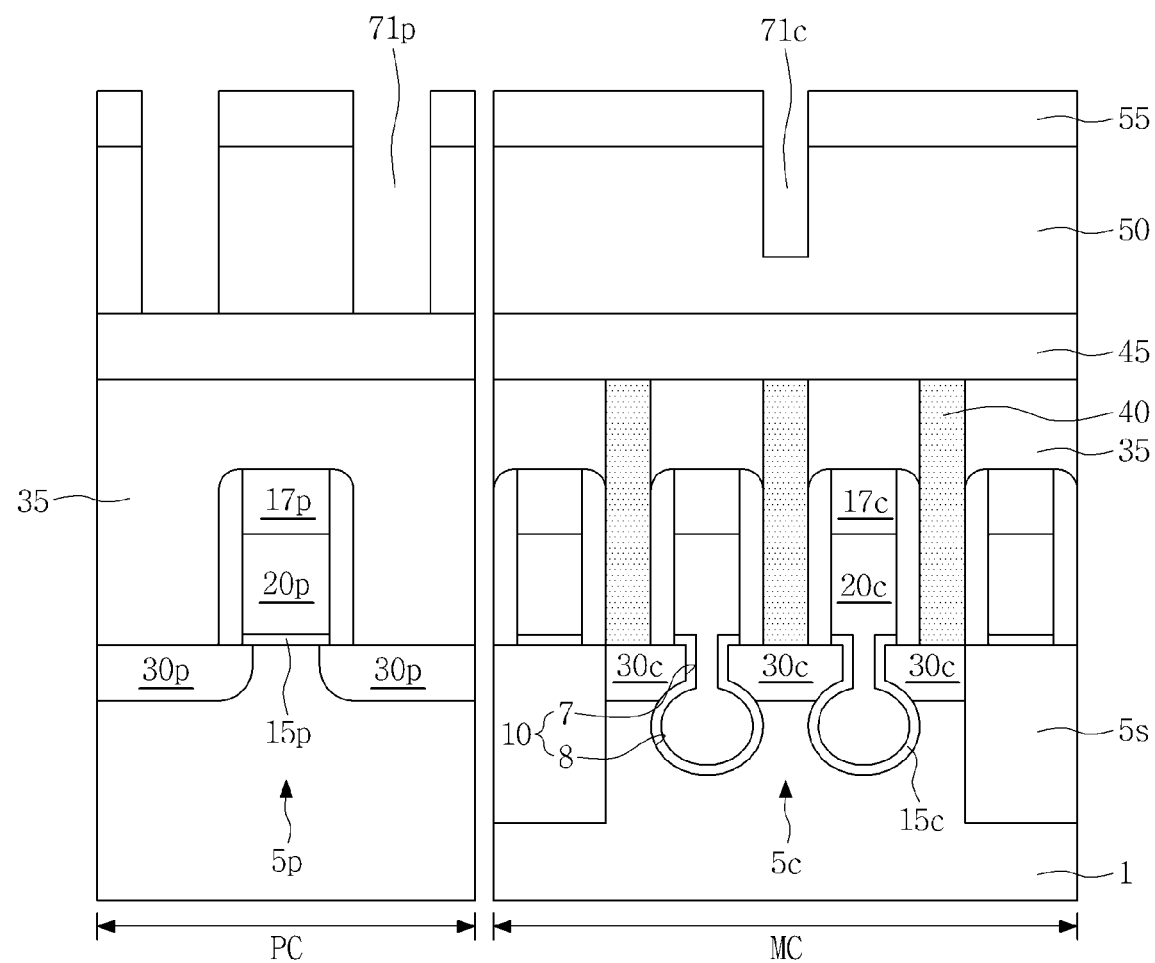

Referring to FIGS. 1 and 2E, the etching mask 50 exposed by the first and second openings 70p and 70c is etched to form a first mask opening 71p passing through the etching mask 50 on the first region pc and exposing the second interlayer insulating layer 45, and simultaneously form a preliminary mask opening 71c not exposing the second interlayer insulating layer 45 on the second region MC. In other words, the first mask opening 71p entirely passes through the etching mask 50 and exposes the second interlayer insulating layer 45, and the preliminary mask opening 71c does not entirely pass through the etching mask 50 so that the second interlayer insulating layer 45 is not exposed.

In the openings 70p and 70c of the sacrificial mask 55, it has been described with reference to FIG. 2D that the second opening 70c has a planar size smaller than that of the first opening 70p by about 30% or less. A planar size ratio between the first mask opening 71p and the preliminary mask opening 71c may be equal to a planar size ratio between the first and second openings 70p and 70c of the sacrificial mask 55.

Therefore, while performing the etching process on the etching mask 50, an etch loading effect is generated due to a difference between the planar size ratios of the first and second openings 70p and 70c of the sacrificial mask 55, and thus, an etching amount of the etching mask 50 exposed by the first opening 70p of the sacrificial mask 55 may be larger than that of the etching mask 50 exposed by the second opening 70c of the sacrificial mask 55. Therefore, the first mask opening 71p having a relatively larger planar area may pass through the etching mask 50 to expose the second interlayer insulating layer 45, and the preliminary mask opening 71p having a relatively smaller planar area may not pass through the etching mask 50 and not expose the second interlayer insulating layer 45.

Figure 2F:
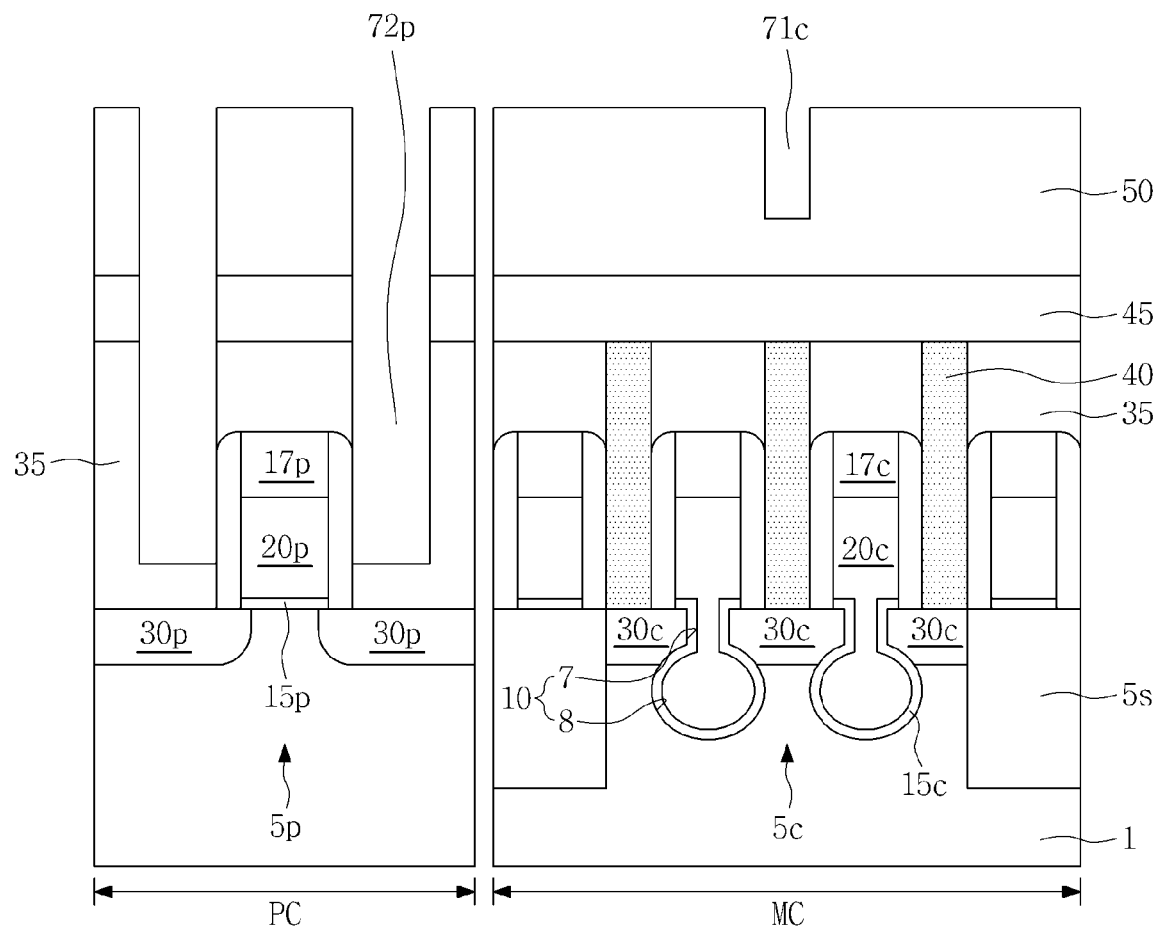

Referring to FIGS. 1 and 2F, by performing the etching process on the first and second interlayer insulating layers 35 and 45, a second contact opening 72p passing through the second interlayer insulating layer 45 exposed by the first mask opening 71p and extending into the first interlayer insulating layer 35 may be formed. Here, the preliminary contact opening 72p may not completely pass through the first interlayer insulating layer 35. Meanwhile, during etching of the first and second interlayer insulating layers 35 and 45 to form the preliminary contact opening 72p, the sacrificial mask 55 may be removed. Alternatively, the sacrificial mask 55 may be selectively etched and removed.

Figure 2G:
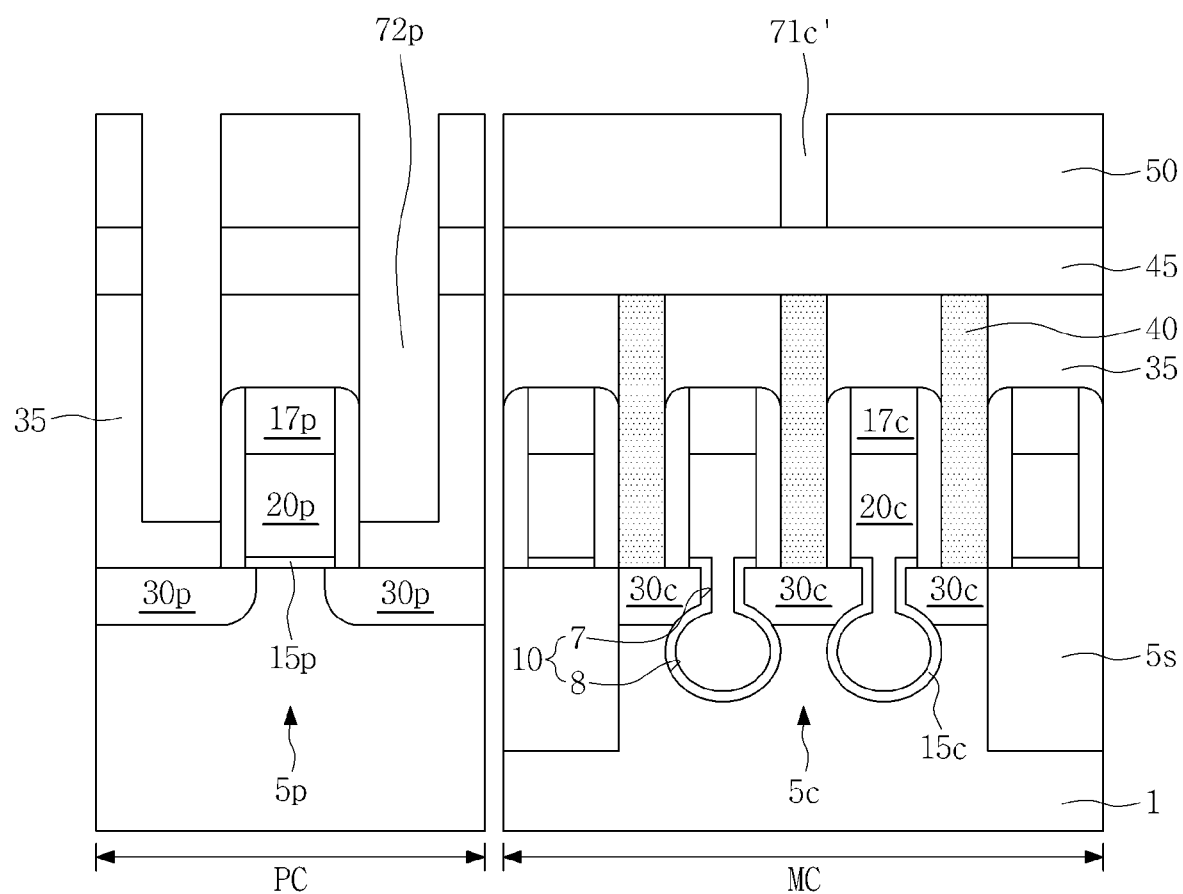

Referring to FIGS. 1 and 2G, the etching mask 50 between a bottom surface of the preliminary mask opening 71c and the second interlayer insulating layer 45 may be etched to form a second mask opening 71c' exposing the second interlayer insulating layer 45 on the second region MC.

Figure 2H:
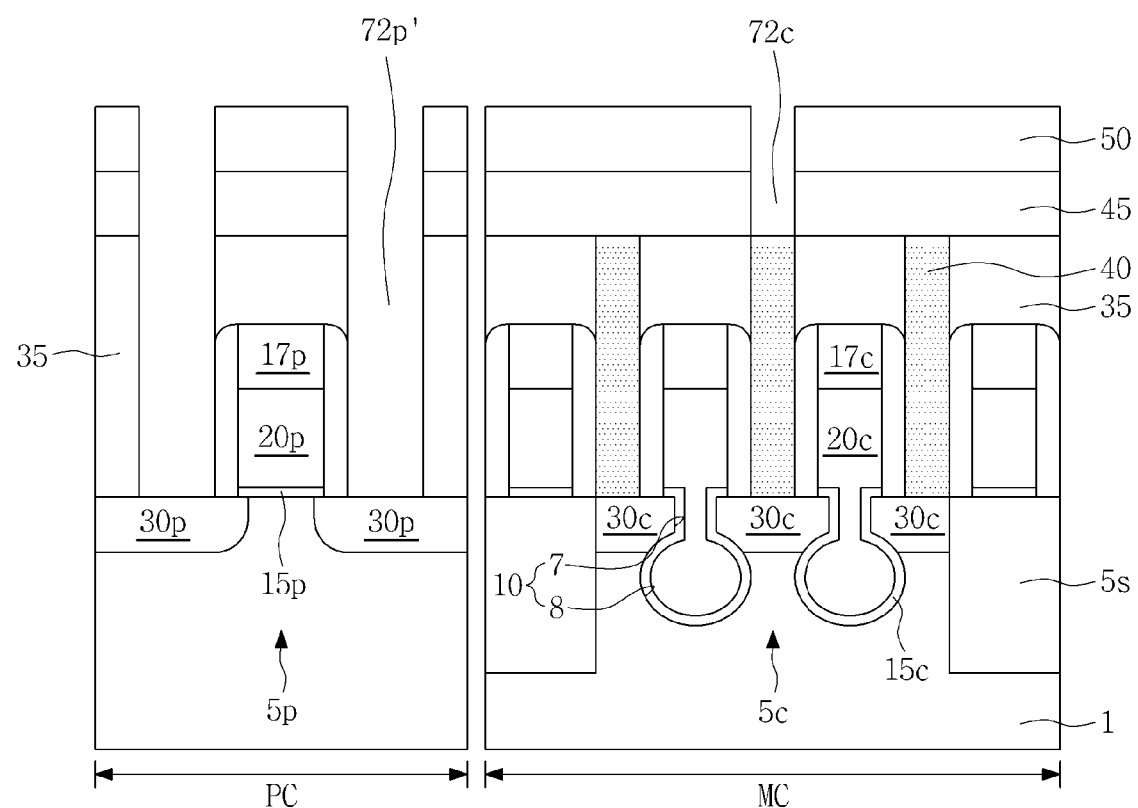

Referring to FIGS. 1 and 2H, using the etching mask 50 as an etching mask, the first interlayer insulating layer 35 remaining under the preliminary contact opening 72p may be etched to form a first contact opening 72p' exposing the first source/drain 30p, and the second interlayer insulating layer 45 exposed by the second mask opening 71c' may be etched to form a second contact opening 72c exposing any one of the conductive patterns 40.

Figure 2I:
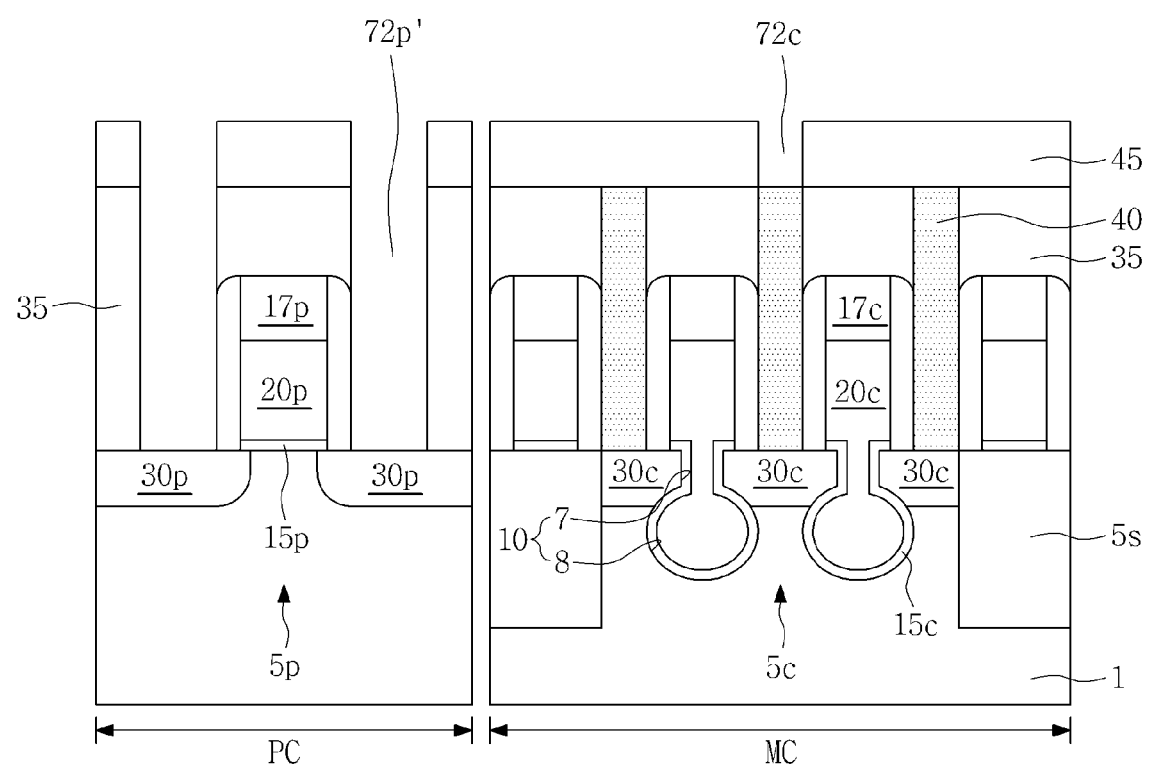

Next, as shown in FIG. 2I, the etching mask 50 may be selectively removed.

As described above, the first contact opening 72p' having a relatively larger depth may be formed by two etching processes (that is, the etching process of FIG. 2F and the etching process of FIG. 2H), and the second contact opening 72c having a relatively smaller depth may be formed by the second etching process (that is, the etching process of the FIG. 2H) for forming the first contact opening 72p'. Therefore, since the second contact opening 72c having a relatively smaller depth is formed by the second etching process (that is, the etching process of FIG. 2H) for forming the first contact opening 72p', during the entire etching process for forming the first contact opening 72p', the second contact opening 72c is not excessively over-etched, and thus, etching damage to the conductive pattern 40 exposed by the second contact opening 72c can be minimized. Therefore, it is possible to stably form elements passing through the insulating layer constituted by the first and second interlayer insulating layers 35 and 45 and having upper surfaces disposed at different heights, that is, the first and second contact openings 72p' and 72c exposing the first source/drain 30p and the conductive pattern 40, respectively.

According to the embodiments, it is possible to form the elements having upper surfaces disposed at different heights, that is, the first and second contact openings 72p' and 72c exposing the first source/drain 30p and the conductive pattern 40, respectively. The first source/drain 30p and the conductive pattern 40 are proposed as an example of the elements having upper surfaces disposed at different heights. Therefore, this embodiment may be applied to form contact openings exposing different elements having upper surfaces disposed at different heights than those of the first source/drain 30p and the conductive pattern 40, illustrated in FIGS. 2B-2J. For example, this embodiment may be applied to form the first contact opening 72p exposing the source/drain 30p and the second contact opening exposing an interconnection or a thin film transistor formed on the first interlayer insulating layer 35 without passing through the first interlayer insulating layer 35 instead of the conductive pattern 40.

In the present specification and claims, the term "elements," as used in connection with the semiconductor substrate 1 (and 100 in FIGS. 3A-3H) refers to active semiconductor regions or electrical contacts connected to the active semiconductor regions. In other words, the term "elements" refers to electrically conductive structures within the semiconductor substrates 1 and 100 and the first insulating layers 35 and 135. For example, referring to FIGS. 2A-2J, the source/drains 30p and 30c, the conductive pattern 40, and the first and second gate electrodes 20p and 20c may all be considered "elements" of the semiconductor circuit, while the isolation region 5s, the gate spacers 25p and 25c, and the non-active portions of the semiconductor substrate 1 are not defined as "elements" of the semiconductor circuit. In addition, other components such as connection pads or leads that are connected the conductive pattern 40 outside the first insulation layer 35 are not considered "elements" according to the present specification and claims. The "elements" may also be referred to as electrical elements or semiconductor elements.

In another embodiment, the first interlayer insulating layer 35 and the second interlayer insulating layer 45 may be formed as one interlayer insulating layer. For example, elements having upper surfaces disposed at different heights may be formed on the semiconductor substrate 1, and a single interlayer insulating layer completely covering the elements and having an upper surface disposed at a level higher than the upper surfaces of the elements may be formed. Even in this case, if the etching mask 50 described in the above embodiment is used, contact openings respectively exposing the elements having upper surfaces disposed at different heights may be stably formed. More specifically, a transistor including the source/drain 30p may be formed on the semiconductor substrate 1, and a pattern having an upper surface disposed at a higher level than the source/drain 30p, for example, a pattern 40 constituting a resistor, a capacitor or an interconnection pad, may be formed, and then, a single interlayer insulating layer covering the transistor including the source/drain 30p and the pattern 40 may be formed. Here, the single interlayer insulating layer may be formed of substantially the same material as the first and second interlayer insulating layers 35 and 45, and may correspond to the first and second interlayer insulating layers 35 and 45.

Figure 2J:
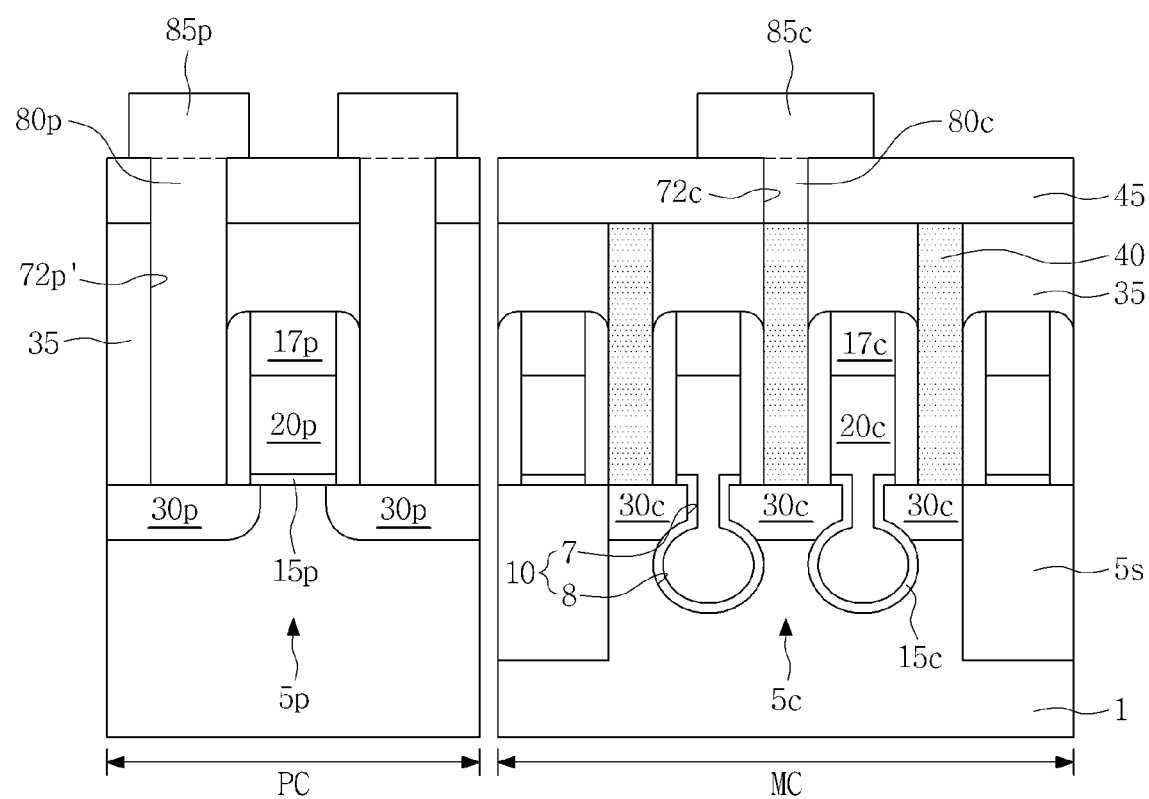

Referring to FIGS. 1 and 2J, a first contact structure 80p filling the first contact opening 72p' may be formed, and also, a second contact structure 80c filling the second contact opening 72c may be formed. Forming the first and second contact structures 80p and 80c may include forming a conductive layer filling the first and second contact openings 72p' and 72c and covering the second interlayer insulating layer 45, and planarizing the conductive layer until the second interlayer insulating layer 45 is exposed. Then, a first conductive pattern 85p may be formed on the first contact structure 80p, and also, a second conductive pattern 85c may be formed on the second contact structure 80c.

In another embodiment, the first and second contact structures 80p and 80c and the first and second conductive patterns 85p and 85c may be simultaneously formed. For example, forming the first and second contact structures 80p and 80c and the first and second conductive patterns 85p and 85c may include forming a conductive layer filling the first and second contact openings 72p' and 72c and covering the second interlayer insulating layer 45, and patterning the conductive layer.

Next, a method of manufacturing a semiconductor device in accordance with another embodiment of the inventive concept will be described with reference to FIGS. 3A to 3H.

Referring to FIGS. 3A to 3H, a substrate 100 having a first region A, a second region B and a third region C may be prepared. The first region A may be a circuit region including a first contact region, the second region B may be a circuit region including a second contact region, and the third region C may be a circuit region including a third contact region. The substrate 100 may be a semiconductor substrate.

An isolation region may be formed on the semiconductor substrate 100 to define a plurality of active regions. The isolation region may be formed using a shallow trench isolation technique.

A first transistor having a first source/drain 130a and a first gate electrode 120a may be formed on the first region A of the substrate 100, and a second transistor having a second source/drain 130b and a second gate electrode 120b may be formed on the second region B of the substrate 100. The first transistor of the first region A may correspond to the first transistor TR1 of the first region PC in FIG. 2A as described in the above embodiment. While it has been described that the second transistor of the second region B is a flat transistor, a three-dimensional transistor such as the second transistor TR2 of the second region MC in FIG. 2A as described in the above embodiment may be formed on the second region B.

First and second gate masks 117a and 117b may be formed on the first and second gate electrodes 120a and 120b. Gate spacers 125a and 125b may be formed on sidewalls of the first and second gate electrodes 120a and 120b and the first and second gate masks 117a and 117b.

A conductive pad 120c and an insulating capping mask 117c may be sequentially deposited on the third region C of the substrate 100. The pad 120c and the capping mask 117c may be simultaneously formed with the first and second gate electrodes 120a and 120b and the first and second gate masks 117a and 117b. For example, a dielectric layer may be formed on the substrate 100, a conductive layer may be formed on the dielectric layer, the first and second gate masks 117a and 117b and the capping mask 117c may be formed on the conductive layer, and the conductive mask may be etched using the first and second gate masks 117a and 117b and the capping mask 117c as an etching mask to form the first and second gate electrodes 120a and 120b and the pad 120c. A gate spacer 125c may also be formed to surround the insulating capping mask 117c and the conductive pad 120c. The gate spacer 125c may be formed simultaneously with the gate spacers 125a and 125b.

In some embodiments, the pad 120c may be a contact pad positioned at an end portion of a gate line. However, the inventive concept is not limited thereto. For example, the pad 120c may be understood as a device pattern for forming various circuits such as a resistor, a capacitor electrode, etc.

Figure 3A:
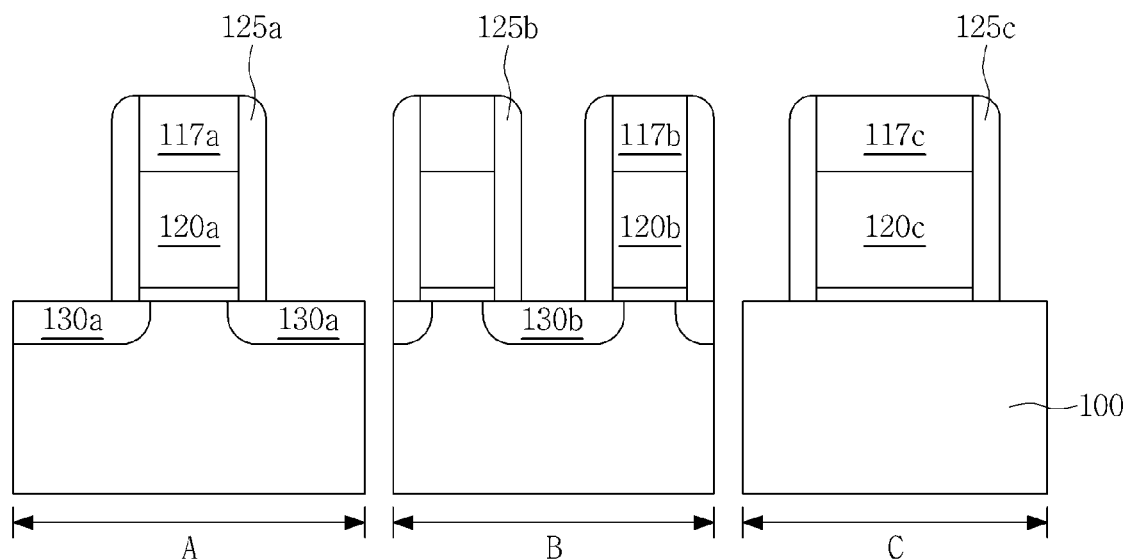
FIGS. 3A to 3H are cross-sectional views of a semiconductor device in accordance with another embodiment of the present general inventive concept.
Figure 3B:
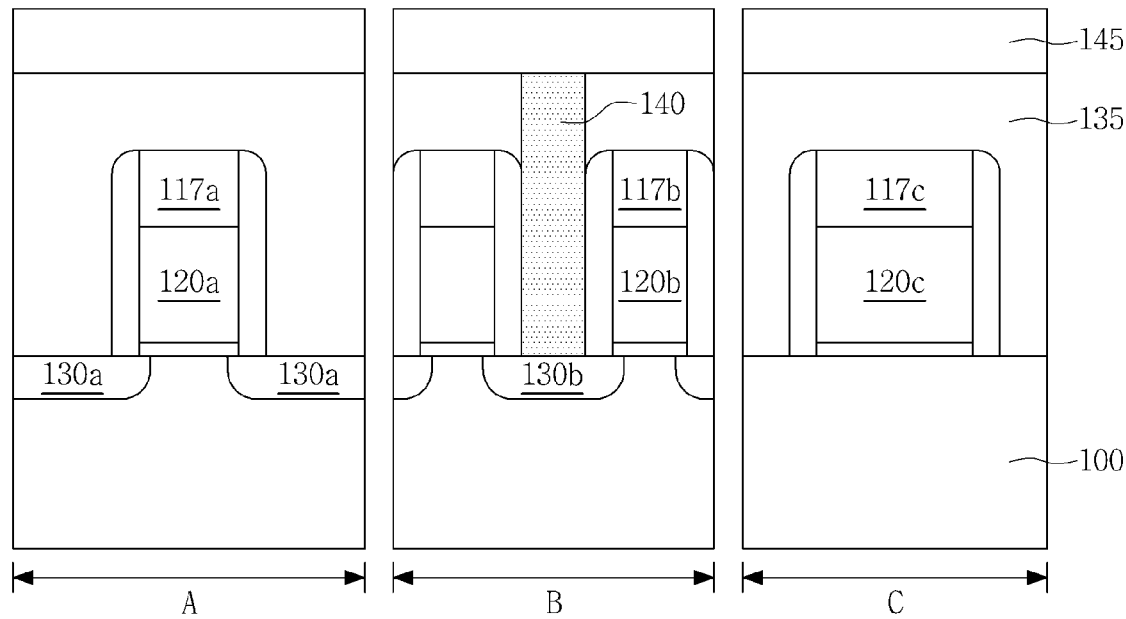

Referring to FIG. 3B, a first interlayer insulating layer 135 may be formed on the resultant structure. The first interlayer insulating layer 135 may be formed to have a flat upper surface. On the second region, a conductive pattern 140 passing through the first interlayer insulating layer 135 and electrically connected to the second source/drain may be formed. The conductive pattern 140 may include at least one of a polysilicon layer, a metal layer, a metal nitride layer, and a metal-semiconductor compound layer.

A second interlayer insulating layer 145 covering the first interlayer insulating layer 135 and the conductive pattern 140 may be formed. The second interlayer insulating layer 145 may be formed of an insulating material such as a silicon oxide, etc. In some embodiments. The second interlayer insulating layer 145 may have a smaller thickness than the first interlayer insulating layer 135.

Figure 3C:
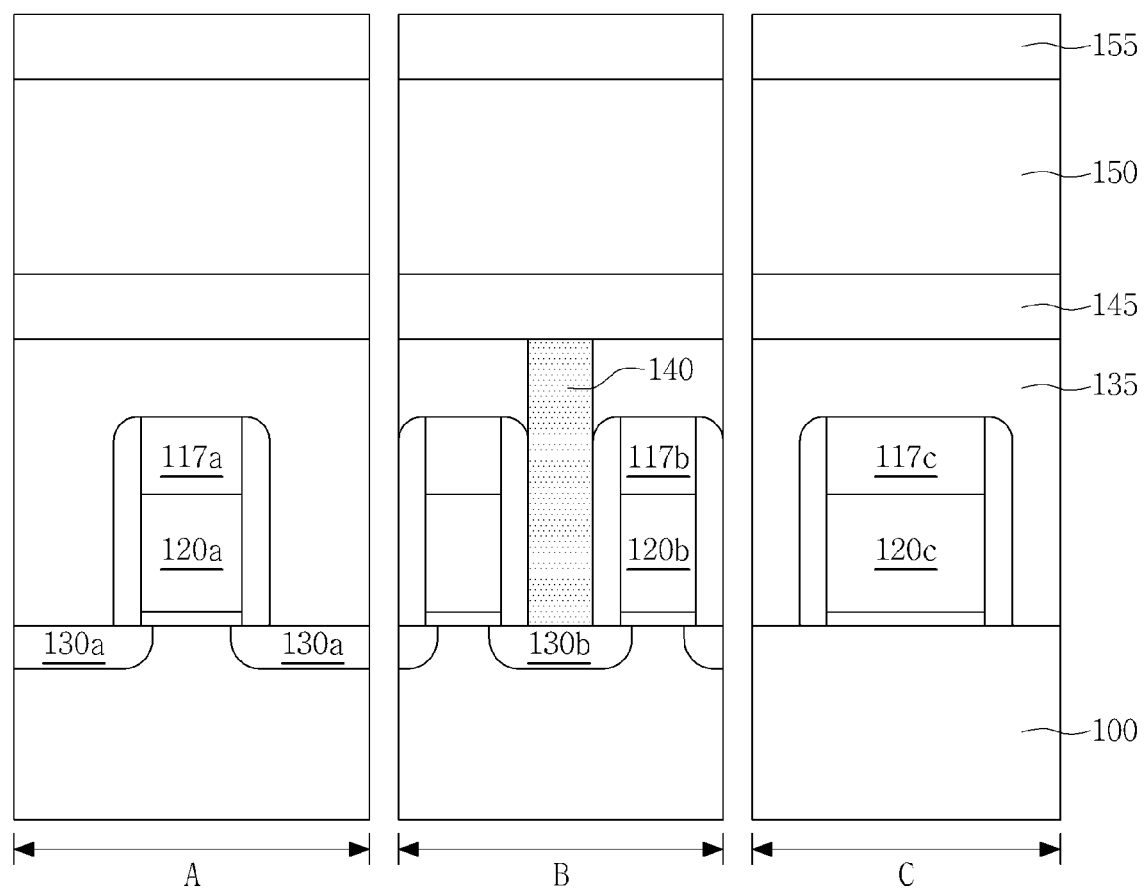

Referring to FIG. 3C, an etching mask 150 and a sacrificial mask 155 may be sequentially formed on the second interlayer insulating layer 145. The etching mask 150 and the sacrificial mask 155 may be substantially the same as the etching mask 50 and the sacrificial mask 55 described with reference to FIG. 2C, and thus, detailed descriptions thereof will not be repeated.

Figure 3D:
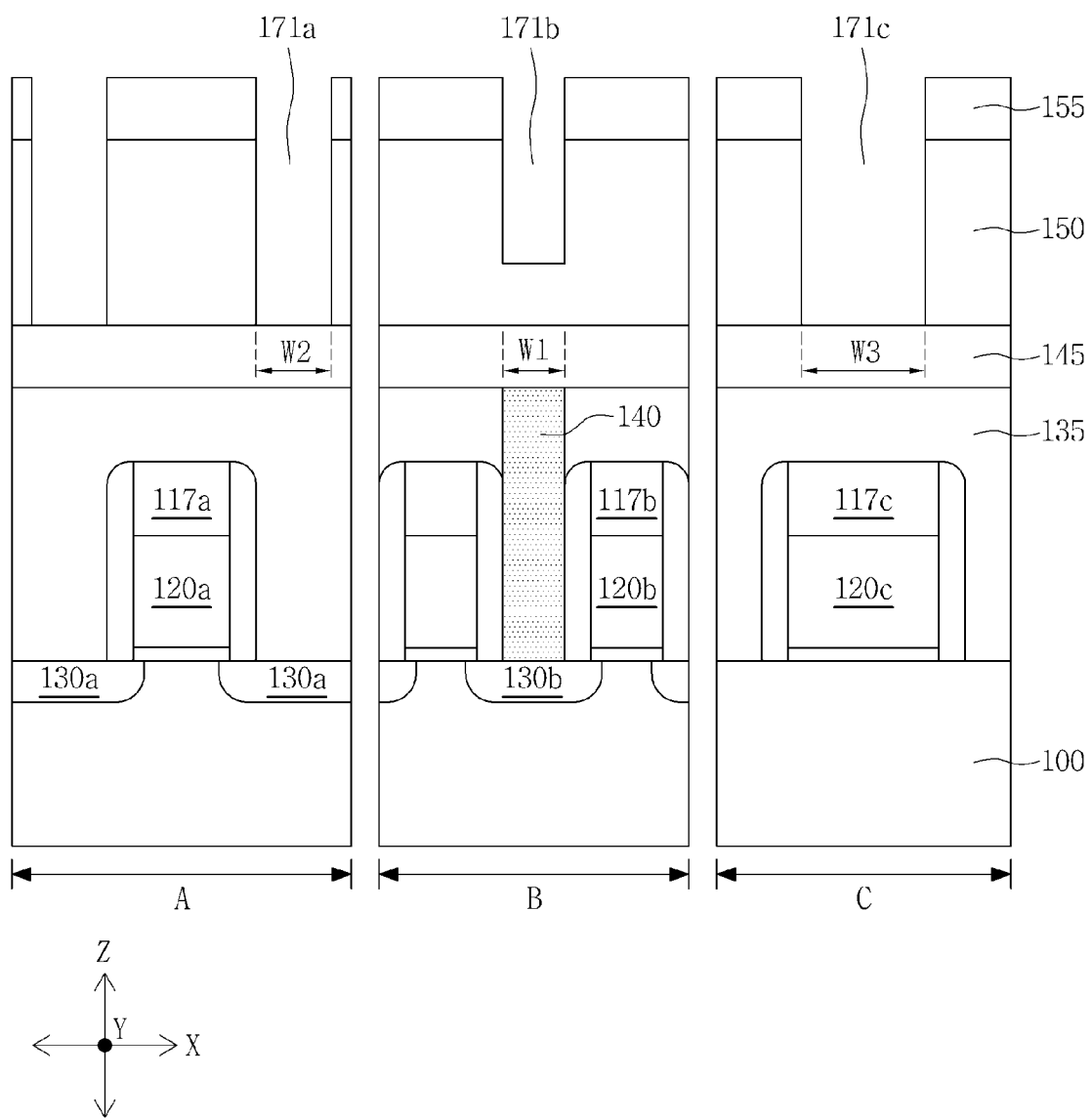

Referring to FIG. 3D, photolithography and etching processes similar to those described with reference to FIGS. 2D and 2E may be performed. More specifically, as described with reference to FIG. 2D, an anti-reflective layer and a photoresist pattern may be formed on the sacrificial mask 155, and the sacrificial mask 155 may be etched to form openings exposing the etching mask 150. Then, as shown in FIG. 2E, the exposed etching mask 150 may be etched to form a first mask opening 171a exposing the second interlayer insulating layer 145 on the first region A, to form a second preliminary mask opening 171b not exposing the second interlayer insulating layer 145 on the second region B, and to form a third mask opening 171c exposing the second interlayer insulating layer 145 on the third region C.

The opening of the sacrificial mask for forming the second preliminary mask opening 171b has a smaller planar area than the openings of the sacrificial mask for forming the first and third mask openings 171a and 171c. Therefore, during the photolithography and etching processes of the etching mask 150, the second preliminary mask opening 171b having a relatively smaller planar area due to an etch loading effect does not pass through the etching mask 150 and does not expose the second interlayer insulating layer 145, and the first and third mask openings 171a and 171c having a relatively larger planar area pass through the etching mask 150 to expose the second interlayer insulating layer 145. As illustrated in FIG. 3D, the first mask opening has a width in along the axis X of W2, the second preliminary mask opening 171b has a width of W1, and the third mask opening has a width of W3. According to the present embodiment, W1<W2, W3. In addition, W2 may be less than W3.

Figure 3E:
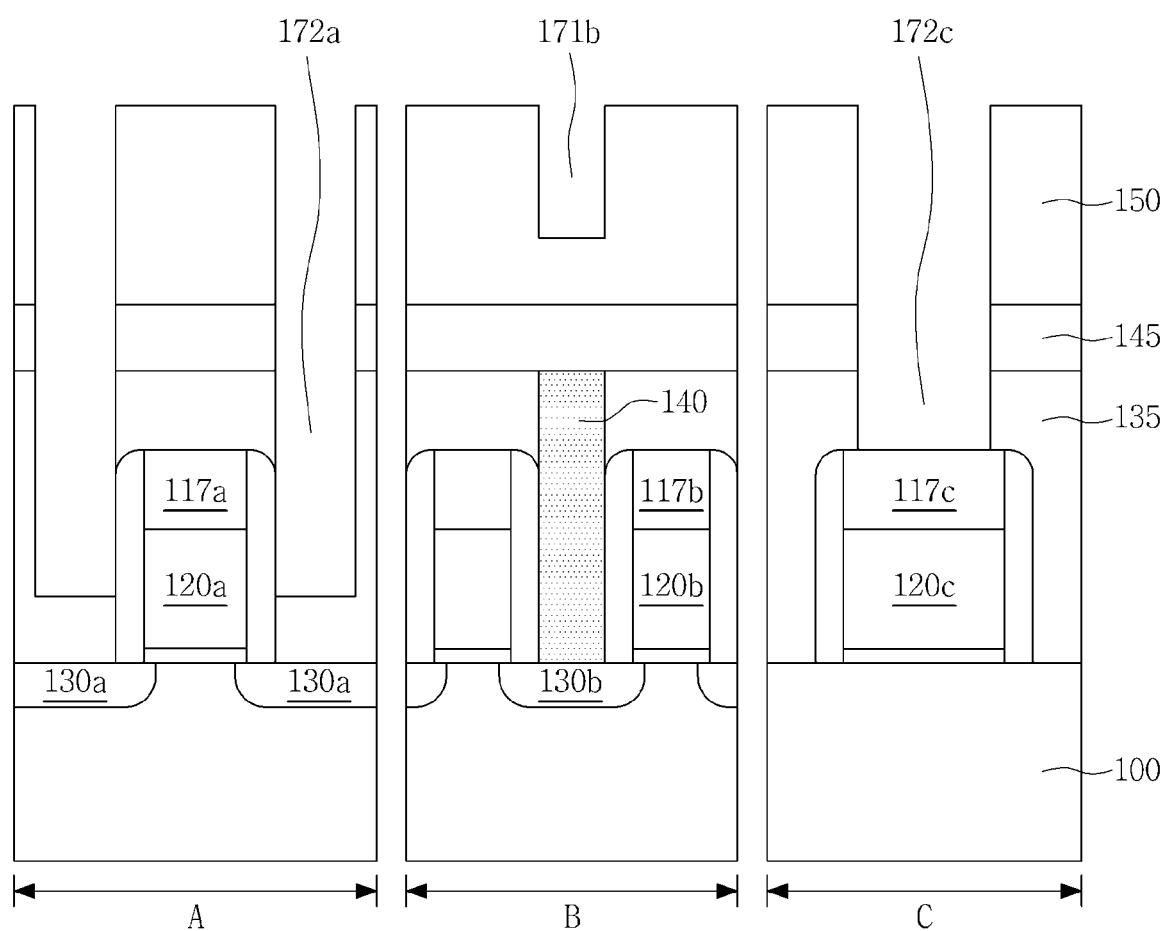

Referring to FIG. 3E, as described with reference to FIG. 2F, the first and second interlayer insulating layers 135 and 145 may be etched using the etching mask 150. As a result, a first preliminary contact opening 172a passing through the second interlayer insulating layer 145 and extending into the first interlayer insulating layer 135 may be formed on the first region A, and a third preliminary contact opening 172c passing through the second interlayer insulating layer 145 and extending into the first interlayer insulating layer 135 may be formed on the third region C. The capping mask 117c may be formed of a different material from the first and second interlayer insulating layers 135 and 145. Therefore, forming the first and third preliminary contact openings 172a and 172c may include a process of etching the first and second interlayer insulating layers 135 and 145 without etching the capping mask 117c.

The sacrificial mask 155 may be removed. For example, the sacrificial mask 155 may be removed during the etching process of forming the first and third preliminary contact openings 172a and 172c. Otherwise, the sacrificial mask 155 may be selectively etched and removed.

Figure 3F:
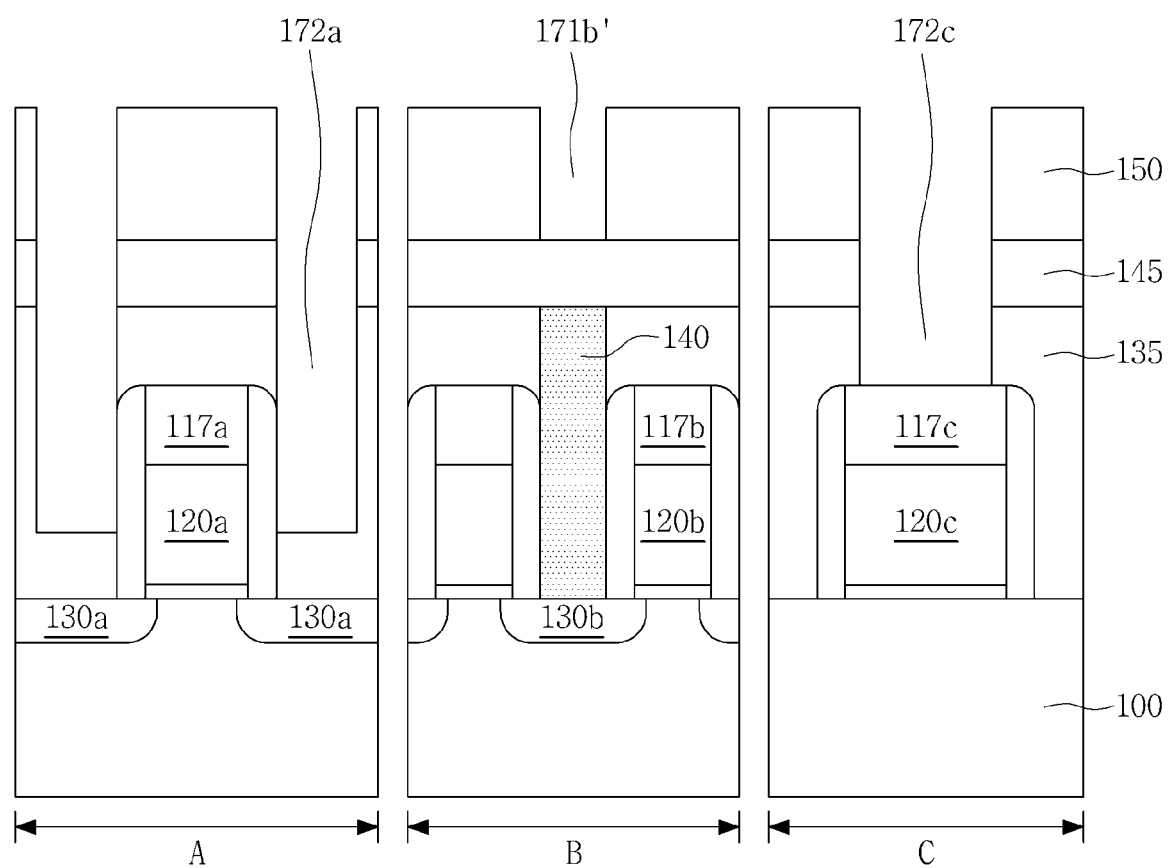

Referring to FIG. 3F, the etching mask 150 disposed between the bottom surface of the second preliminary mask opening 171b of the etching mask 150 and the second interlayer insulating layer 145 may be etched to form a second mask opening 171b' passing through the etching mask 150 and exposing the second interlayer insulating layer 145 on the second region B.

Figure 3G:
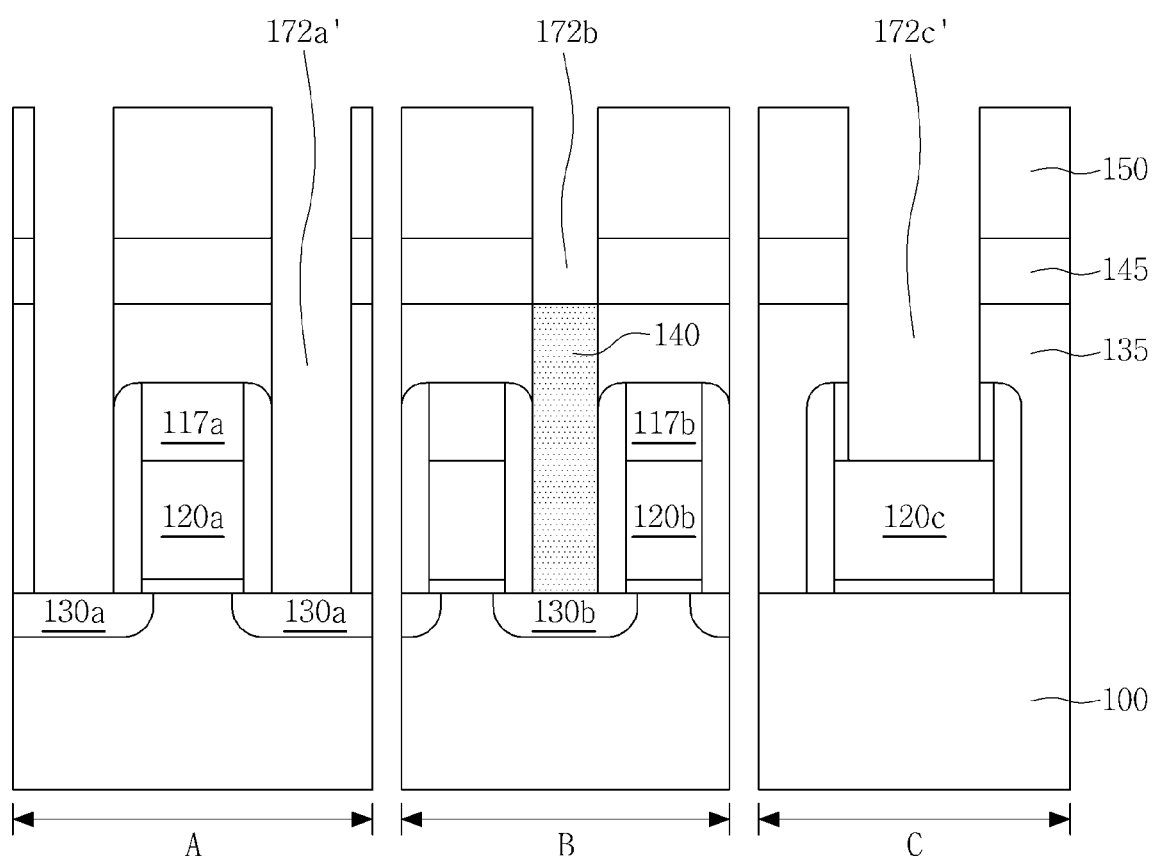

Referring to FIG. 3G, the insulating layers 135 and 145 to be exposed by the first preliminary contact opening 172a, the second mask opening 171b', and the third preliminary contact opening 172c of the etching mask 150 may be etched to form a first contact opening 172a' passing through the first and second interlayer insulating layers 135 and 145 and exposing the first source/drain 130a on the first region A, to form a second contact opening 172b passing through the second interlayer insulating layer 145 and exposing the conductive pattern 140 on the second region B, and to form a third contact opening 172c' passing through the first and second interlayer insulating layers 135 and 145 and the capping mask 117c and exposing the pad 120c on the third region C.

Figure 3H:
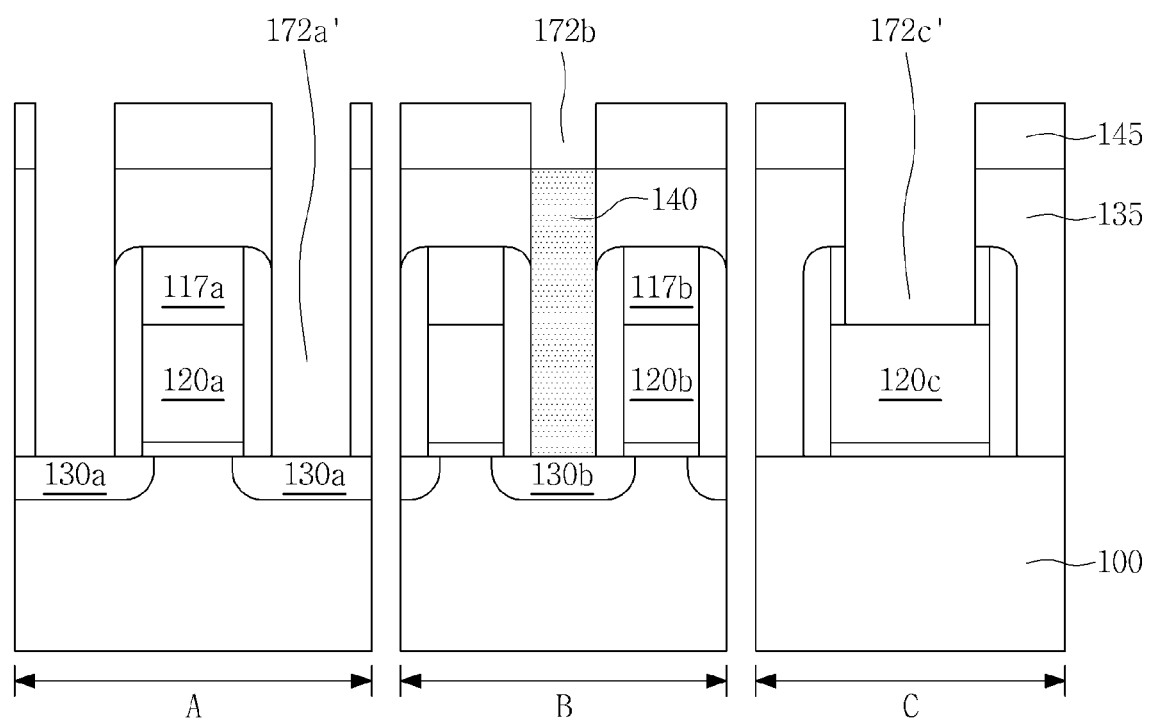

Next, the etching mask 150 remaining as shown in FIG. 3H may be removed.

Figure 4:
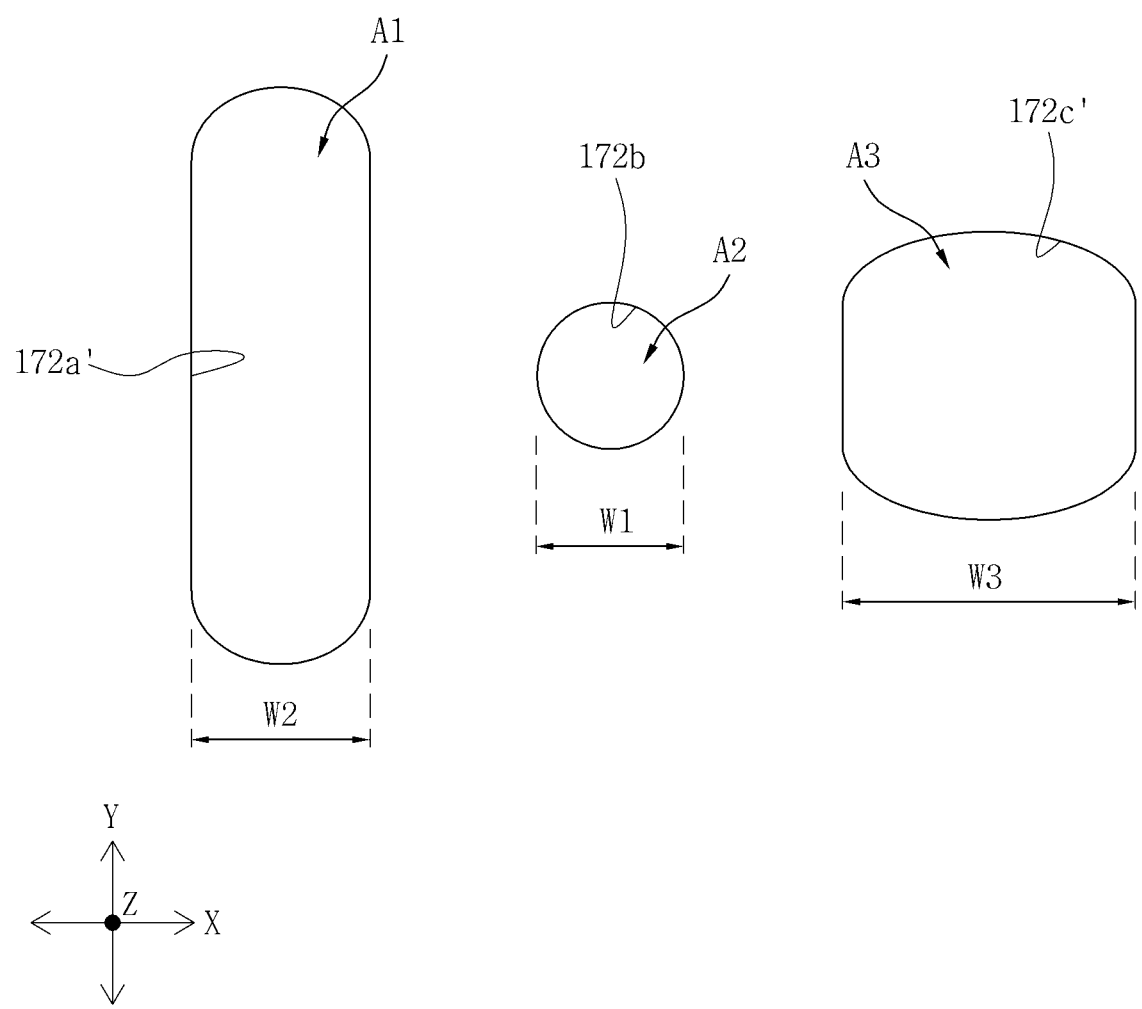
FIG. 4 is a plan view of a contact in accordance with another embodiment of the present general inventive concept.

In some embodiments, as shown in a plan view of FIG. 4, the first contact opening 172a' may have a larger planar area A1 than the second and third contact openings 172b and 172c', which have planar areas of A2 and A3, respectively. Therefore, the openings 171a, 171b and 171c of the etching mask 150 for forming the first to third contact openings 172a', 172b and 172c' may have planar areas corresponding to the first to third contact openings 172a', 172b and 172c'. Here, the planar shape of the first to third contact openings 172a', 172b and 172c' is not limited to the shape as shown in FIG. 4 but may have various shapes such as a rectangular, circular or oval shape depending on the sizes and kinds of circuits to be formed.

The semiconductor device in accordance with embodiments of the inventive concept may be implemented as various apparatus and/or systems or may be used as an element of various apparatus and/or systems. For example, the semiconductor device may be applied to implement various memory devices, for example, various memory cards, USB memories, solid-state drivers, etc.

Figure 5:
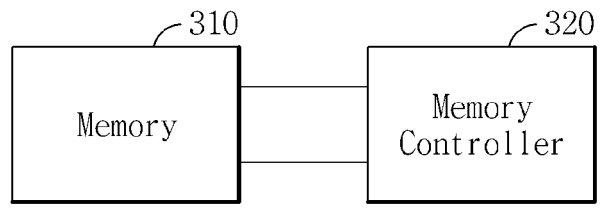
FIGS. 5 to 12 are views of an apparatus and system including a semiconductor device formed through a method of fabricating a semiconductor device in accordance with embodiments of the present general inventive concept.

FIG. 5 is a schematic view of an apparatus including a memory 310 and a memory controller 320. The memory 310 and/or the memory controller 320 may be formed by a manufacturing method including a contact forming method according to any one of the embodiments of the inventive concept.

The memory controller 320 may supply an input signal to control an operation of the memory 310. For example, the memory controller 320 may provide commands and address signals. The memory controller 320 may control the memory 310 on the basis of the received control signal.

The memory 310 and/or the controller 320 may be mounted using various shapes of packages. For example, the memory 310 and/or the controller 320 may be mounted using packages such as a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system in package (SIP), a multi chip package (MCP), a wafer-level fabricated package (WFP), a wafer-level processed stack package (WSP), etc.

Figure 6:
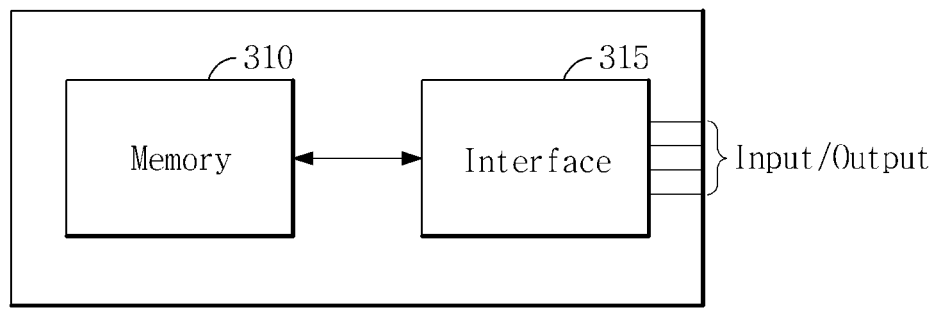

FIG. 6 is a schematic view of an apparatus including a memory 310 connected to an interface 315. The interface 315 may provide an input signal generated from the exterior. For example, the interface 315 may provide commands and address signals.

Figure 7:
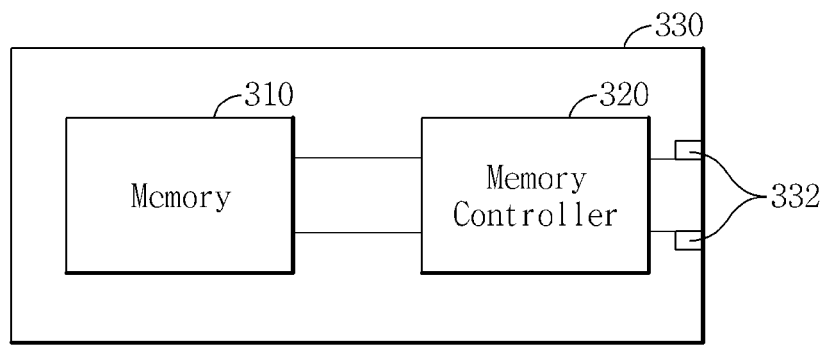

FIG. 7 is a schematic view showing a memory card 330. The memory 310 and the memory controller 320 described with respect to FIG. 5 may be implemented by the memory card 330. Contacts 332 may electrically connect the memory controller 320 to an external device. The memory card 330 may be used for an electronic apparatus, for example, a digital camera, a computer, etc.

Figure 8:
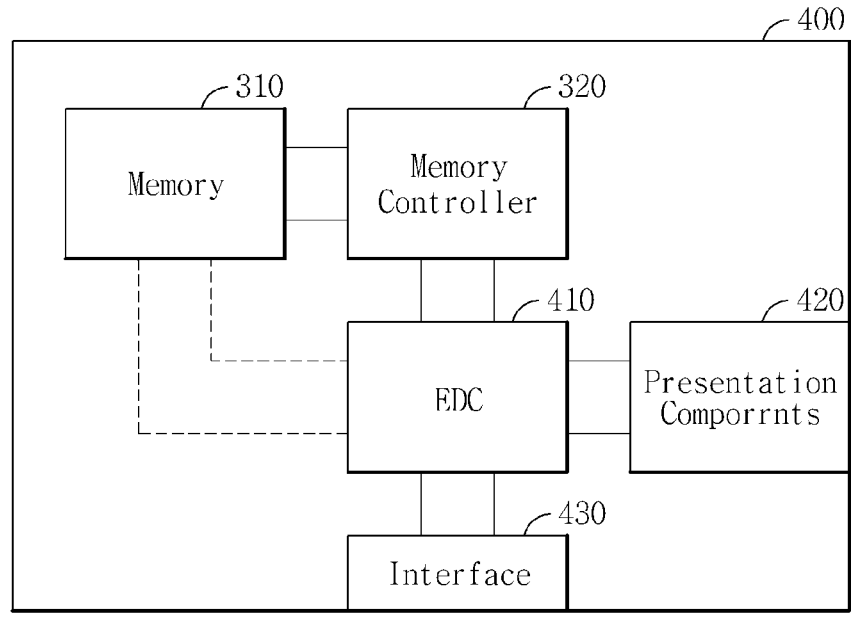

FIG. 8 is a schematic view of a mobile device 400. The mobile device 400 may be an MP3 player, a video player, a video and audio player, etc. The mobile device 400 may include a memory 310 and a memory controller 320. The mobile device 400 may include an encoder and decoder (EDC) 410, a display part 420, and an interface 430. Data (video, audio, etc) may be transmitted between the memory 310 and the encoder and decoder (EDC) 410 via the memory controller 320. As shown in dotted lines, data may be directly transmitted between the memory 310 and the encoder and decoder (EDC) 410.

The EDC 410 may encode data to be stored in the memory 310. For example, the EDC 410 may MP3-encode audio data to store the data in the memory 310. In addition, the EDC 410 may encode MPEG video data (for example, MPEG3, MPEG4, etc.) to store the data in the memory 310. The EDC 410 may include a plurality of encoders for encoding different types of data according to different data formats. For example, the EDC 410 may include an MP3 encoder for audio data and an MPEG encoder for video data. The EDC 410 may decode data output from the memory 310. For example, the EDC 410 may MP3-decode the audio data output from the memory 310.

In addition, the EDC 410 may MPEG-decode (for example, MPEG3, MPEG4, etc.) the video data output from the memory 310. Further, the EDC 410 may include a plurality of decoders for decoding different types of data according to different data formats. For example, the EDC 410 may include an MP3 decoder for audio data and an MPEG decoder for video data. Further, the EDC 410 may include a decoder only. For example, after the encoded data is transmitted to the EDC 410 and decoded, the decoded data may be transmitted to the memory controller 320 and/or the memory 310.

The EDC 410 may receive data for encoding or pre-encoded data via the interface 430. The interface 430 may be provided according to a well-known standard (for example, a universal serial bus (USB), a FireWire, etc.). The interface 430 may include at least one interface. The data provided from the memory 310 may be output through the interface 430.

The display part 420 may display the data decoded by the memory 310 and/or the EDC 410 to be recognized by a user. For example, the display part 420 may include a display screen for outputting video data, a speaker jack for outputting audio data, and so on.

Figure 9:
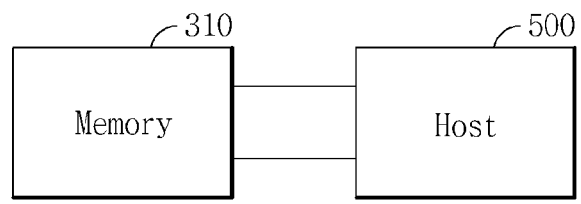

FIG. 9 is a schematic view of a host system 500 connected to the memory 310. The host system 500 may be a processing system such as a computer, a digital camera, etc. The memory 310 may be a detachable storage medium, for example, a memory card, a USB memory, a solid state driver (SSD), etc. The host system 500 may provide commands and address signals.

Figure 10:
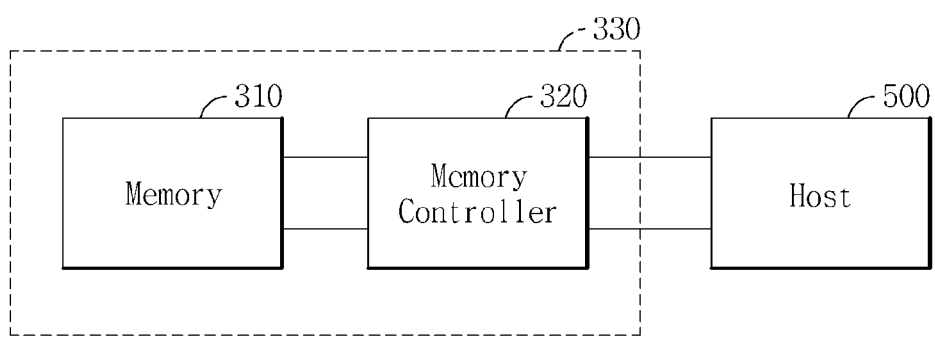

FIG. 10 is a schematic view of a host system 500 connected to a memory card 330. The host system 500 may be connected to the memory card 330 shown in FIG. 7. The host system 500 may provide a control signal to the memory card 330 to control operations of the memory controller 320 and the memory 310.

Figure 11:
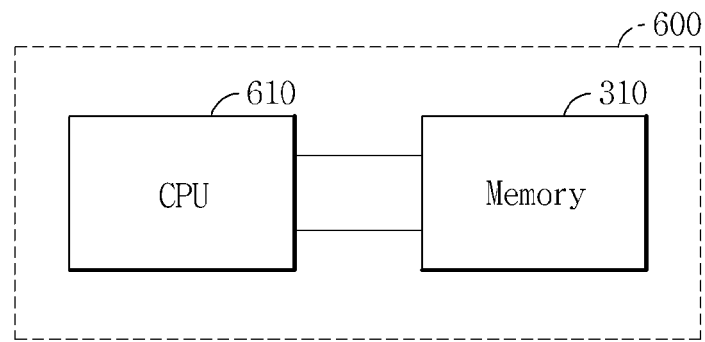

FIG. 11 is a schematic view of a computer system 600. The memory 310 may be connected to a central processing unit (CPU) 610 in a computer system 600. For example, the computer system 600 may be a personal computer, a personal data assistant (PDA), etc. The memory 310 may be connected to the CPU 610 via a bus.

Figure 12:
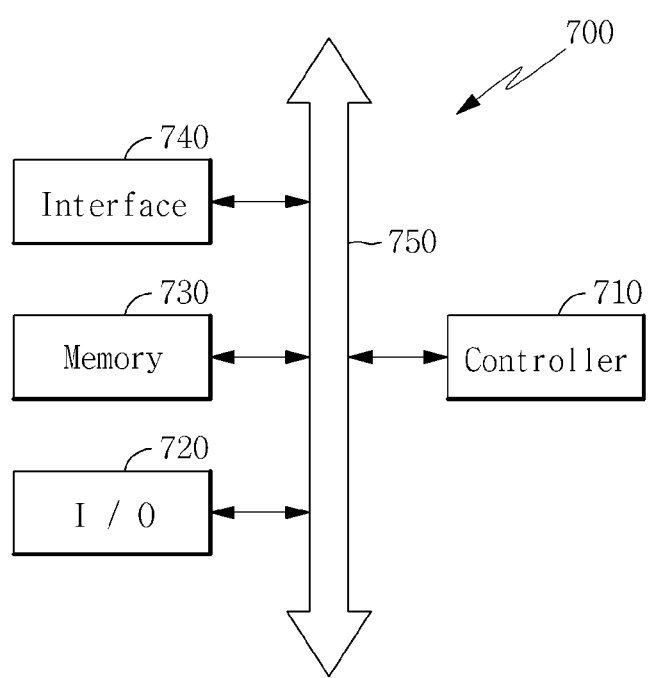

FIG. 12 is a schematic view of an apparatus 700 including a controller 710, an input/output device 720, a memory 730, and an interface 740. The respective elements of the apparatus 700 may be connected to each other through a bus 750. The input/output device 720 may be a device such as a keyboard, a display, etc. The controller 710 may include at least one microprocessor, digital processor, microcontroller, or processor. The memory 730 may store the data and/or the commands executed by the controller 710. The interface 740 may be used to transmit data from another system, for example, a communication network, etc.

The apparatus 700 may be a mobile system such as a PDA, etc., a mobile computer, a web tablet, a wireless phone, a mobile phone, a digital music player, a memory card, or a system that can transmit and/or receive information.

As can be seen from the foregoing, a first contact opening having a relatively larger depth may be formed through two etching processes, and a second contact opening having a relatively smaller depth may be formed at the second etching process in which the first contact opening is formed. Therefore, since the second contact opening having a relatively larger depth is formed by the second etching process in which the first contact opening is formed, during the entire etching process for forming the first contact opening, it is possible to prevent excessive over-etch of the second contact opening and minimize etching damage to the contact region exposed by the second contact opening.

Therefore, it is possible to improve reliability of the process for forming the contact openings passing through the insulating layer configured to cover elements having upper surfaces disposed at different heights and exposing the elements.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor device, comprising:

preparing a substrate having a first region and a second region;

forming a first element on the first region of the substrate;

forming a second element having an upper surface disposed at a higher level than the first element on the second region of the substrate;

forming an insulating layer covering the first and second elements;

forming a mask on the insulating layer;

performing photolithography and etching processes on the mask to form a first mask opening passing through the mask and exposing the insulating layer on the first region, and to form a preliminary mask opening not exposing the insulating layer on the second region;

etching the insulating layer exposed by the first mask opening to form a preliminary contact opening on the first region;

etching the mask remaining under the preliminary mask opening to form a second mask opening on the second region to expose the insulating layer under the preliminary mask opening; and etching the insulating layer between a bottom region of the preliminary contact opening and the first element on the first region to form a first contact opening exposing the first element, and etching the insulating layer exposed by the second mask opening on the second region to form a second contact opening exposing the second element.

2. The method according to claim 1, wherein the mask is formed of a different material than the insulating layer.

3. The method according to claim 1, further comprising removing the mask.

4. The method according to claim 1, further comprising forming conductive contact plugs filling the first and second contact openings.

5. The method according to claim 1, wherein the second contact opening has a smaller planar area than the first contact opening.

6. The method according to claim 1, wherein the first and second elements comprise different conductive materials.

7. The method according to claim 1, wherein the first and second elements comprise a silicon material.

8. The method according to claim 1, further comprising:
forming a sacrificial mask having openings on the mask, after forming the mask; and
etching and removing the sacrificial mask while etching the insulating layer to form the preliminary contact opening.

9. The method according to claim 1, wherein forming the insulating layer comprises:
forming a first insulating layer after forming the first element; and
after forming the second element, forming a second insulating layer covering the second element and the first insulating layer.

10. The method according to claim 1, wherein the first element is a source/drain of a first MOS transistor, and the second element is a conductive pattern formed on a source/drain of a second MOS transistor.

11. The method according to claim 1, further comprising:
forming a third element having an upper surface covered by a capping layer on a third region of the substrate, before forming the insulating layer;
forming a third mask opening passing through the mask to expose the insulating layer on the third region while forming the first mask opening;
etching the insulating layer on the third region to form a third preliminary contact opening while forming the preliminary contact opening; and
etching the capping layer under the third preliminary contact opening and forming a third contact opening to expose the third element while forming the first and second contact openings.

12. The method according to claim 11, wherein the capping layer is formed of a different material than the insulating layer.

13. The method according to claim 1, wherein the insulating layer comprises a silicon oxide layer, and the mask comprises at least one of a carbon-containing insulating material and a silicon material.

14. A method of fabricating a semiconductor device, comprising:
preparing a substrate having a first region and a second region;
forming a first transistor including a first gate electrode and a first source/drain on the first region of the substrate, and forming a second transistor including a second gate electrode and a second source/drain on the second region of the substrate;
forming a first interlayer insulating layer on the substrate having the first and second transistors;
forming a conductive pattern passing through the first interlayer insulating layer and electrically connected to the second source/drain;
forming a second interlayer insulating layer covering the conductive pattern and the first interlayer insulating layer;
forming a mask on the second interlayer insulating layer;
performing photolithography and etching processes on the mask to form a first mask opening passing through the mask and exposing the second interlayer insulating layer on the first region, and to form a preliminary mask opening not exposing the second interlayer insulating layer on the second region;
etching the first and second interlayer insulating layers under the first mask opening without exposing the first source/drain to form a preliminary contact opening passing through the second interlayer insulating layer and extending into the first interlayer insulating layer on the first region;
etching a mask remaining under the preliminary mask opening, and forming a second mask opening to expose the second interlayer insulating layer under the preliminary mask opening on the second region;
etching the first interlayer insulating layer remaining between a bottom region of the preliminary contact opening and the first source/drain to form a first contact opening exposing the first source/drain on the first region, and etching the second interlayer insulating layer exposed by the second mask opening to form a second contact opening exposing the conductive layer pattern on the second region; and
removing the mask.

15. A method of fabricating a semiconductor device having at least first and second electrical contact surfaces and at least one insulation layer on the semiconductor substrate,
the first electrical contact surface having a depth greater than the second electrical contact surface with respect to an upper surface of the insulation layer, the method comprising:
etching the at least one insulation layer to form first and second holes in first and second regions of the insulation layer above the first and second electrical contact surfaces, respectively, to expose the first and second electrical contact surfaces,
the first hole having a planar area larger than the second hole, such that the first hole has a depth greater than the second hole after a same etching process is performed in each of the first and second regions,
wherein etching the at least one insulation layer includes:
forming an etching mask on the second insulation layer;
performing at least a first etching to expose the second insulation layer via the first hole and to form the second hole in the etching mask to not expose the second insulation layer;
performing at least a second etching to extend the first hole into the first insulation layer without exposing the first electrical contact surface and to extend the second hole to expose the second insulation layer; and
performing at least a third etching to extend each of the first and second holes to expose each of the first and second contact surfaces, respectively.

16. The method of claim 15, further comprising:
forming a sacrificial mask on the etching mask;
locating a photoresist pattern above the sacrificial mask; and
performing a photolithography process to form holes in the sacrificial mask to expose an upper surface of the etching mask, the holes in the sacrificial mask corresponding to locations of the first and second holes.

17. The method of claim 15, wherein the at least second etching includes a first sub-etching process to etch only the first region to extend the first hole into the first insulation, and a second sub-etching process to etch only the second region to extend the second hole to expose the second insulation layer.

18. The method of claim 15, wherein performing the third etching includes simultaneously etching each of the first region and the second region to simultaneously extend each of the first hole and the second hole to expose each of the first electrical contact region and the second electrical contact region.

19. The method of claim 15, further comprising:
removing the etching mask.
20. The method of claim 19, further comprising:
filling the first and second holes with a conductive material; and
forming a conductive pattern on the conductive material at a top of at least one of the first and second holes.

* * * * *